(12) United States Patent
Morisue et al.

(10) Patent No.: US 7,476,572 B2
(45) Date of Patent: Jan. 13, 2009

(54) METHOD FOR MANUFACTURING THIN FILM TRANSISTOR

(75) Inventors: Masafumi Morisue, Kanagawa (JP); Gen Fujii, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 301 days.

(21) Appl. No.: 10/592,527

(22) PCT Filed: Mar. 15, 2005

(86) PCT No.: PCT/JP2005/005063
§ 371 (c)(1),
(2), (4) Date: Sep. 12, 2006

(87) PCT Pub. No.: WO2005/093813
PCT Pub. Date: Oct. 6, 2005

(65) Prior Publication Data
US 2007/0196962 A1   Aug. 23, 2007

(30) Foreign Application Priority Data
Mar. 25, 2004 (JP) .............................. 2004-088848

(51) Int. Cl.
*H01L 21/00* (2006.01)
*H01L 21/84* (2006.01)
(52) U.S. Cl. .................. 438/149; 438/151; 257/E21.32
(58) Field of Classification Search .................. 438/149, 438/150, 151; 257/E21.32, E21.561, E21.7
See application file for complete search history.

(56) References Cited

U.S. PATENT DOCUMENTS

| 6,416,583 | B1 | 7/2002 | Kitano et al. |
| 6,627,263 | B2 | 9/2003 | Kitano et al. |
| 6,884,700 | B2 | 4/2005 | Aoki et al. |
| 7,226,819 | B2* | 6/2007 | Maekawa et al. ........... 438/149 |
| 2004/0029364 | A1 | 2/2004 | Aoki et al. |

FOREIGN PATENT DOCUMENTS

| JP | 03-041732 | 2/1991 |
| JP | 03-152807 | 6/1991 |
| JP | 11-326951 | 11/1999 |
| JP | 2000-188251 | 7/2000 |
| JP | 2002-185005 | 6/2002 |
| JP | 2003-124215 | 4/2003 |

OTHER PUBLICATIONS

International Search Report (Application No. PCT/JP2005/005063;PCT7790) Dated Jun. 28, 2006.
Written Opinion (Application No. PCT/JP2005/005063; PCT7790) Dated Jun. 28, 2005.

* cited by examiner

*Primary Examiner*—Hoai V Pham
(74) *Attorney, Agent, or Firm*—Nixon Peabody LLP; Jeffrey L. Costellia

(57) ABSTRACT

An object of the invention is to provide a method for manufacturing a thin film transistor in a self-aligning manner by using the droplet discharging method regardless of the accuracy of a discharge position for a droplet discharging device. In view of the object, an organic resin film or the like is applied and processed into a predetermined shape by etchback, exposure, development and the like. By utilizing the organic resin film with the predetermined shape as a mask, a semiconductor layer containing an impurity of one conductivity type is etched. By utilizing the organic resin film with the predetermined shape, regions with different wettabilities are formed.

11 Claims, 27 Drawing Sheets

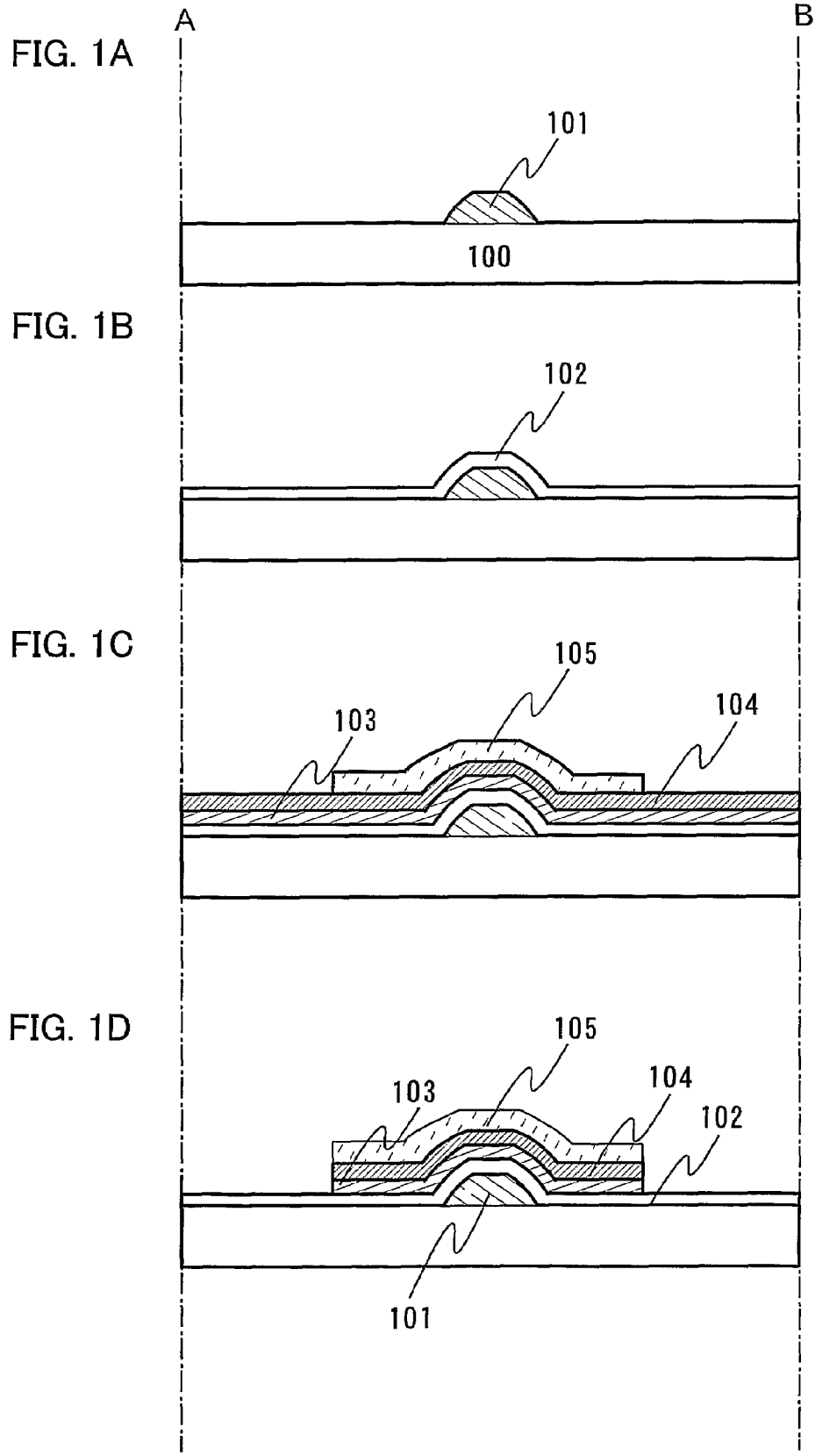

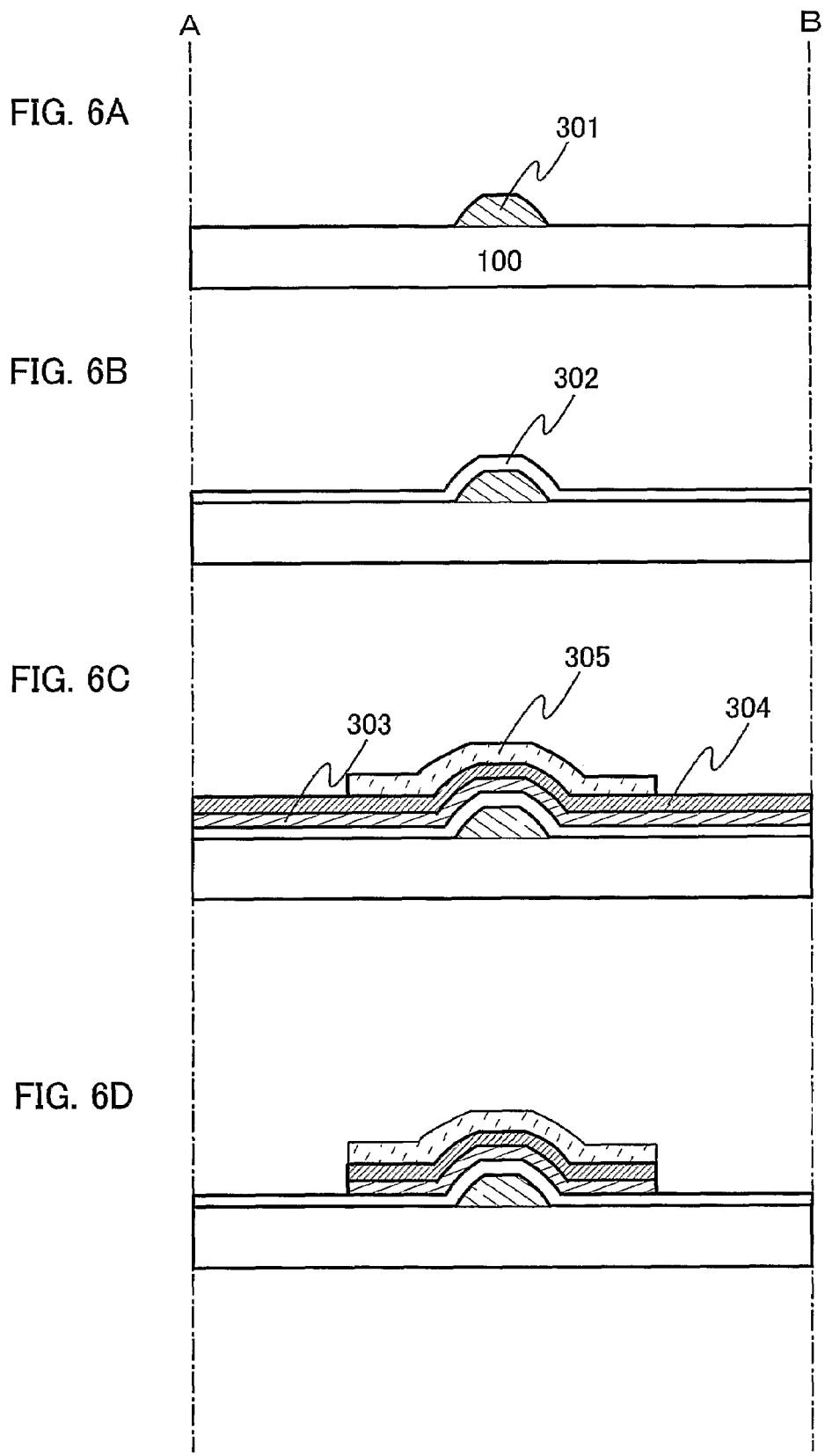

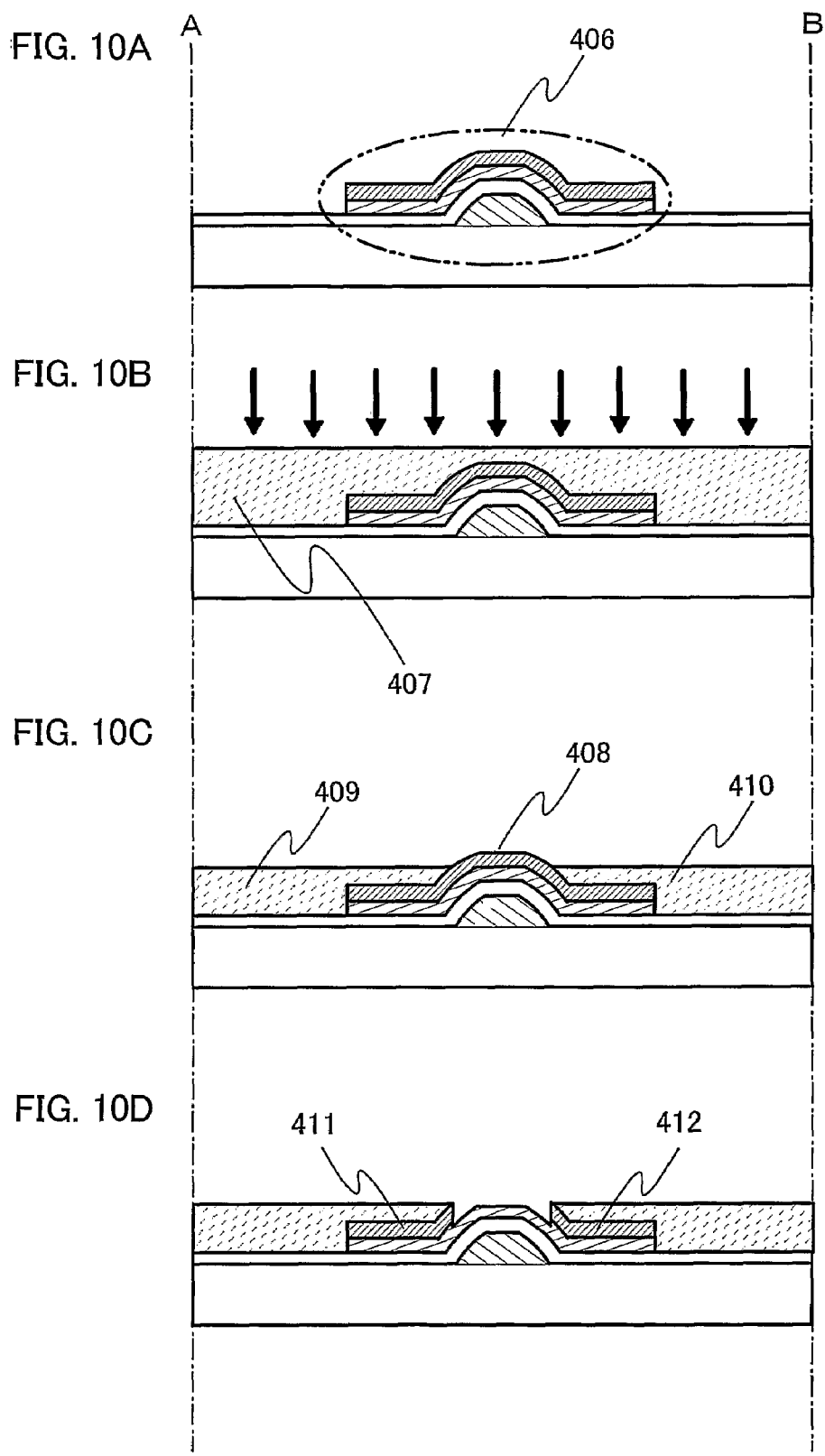

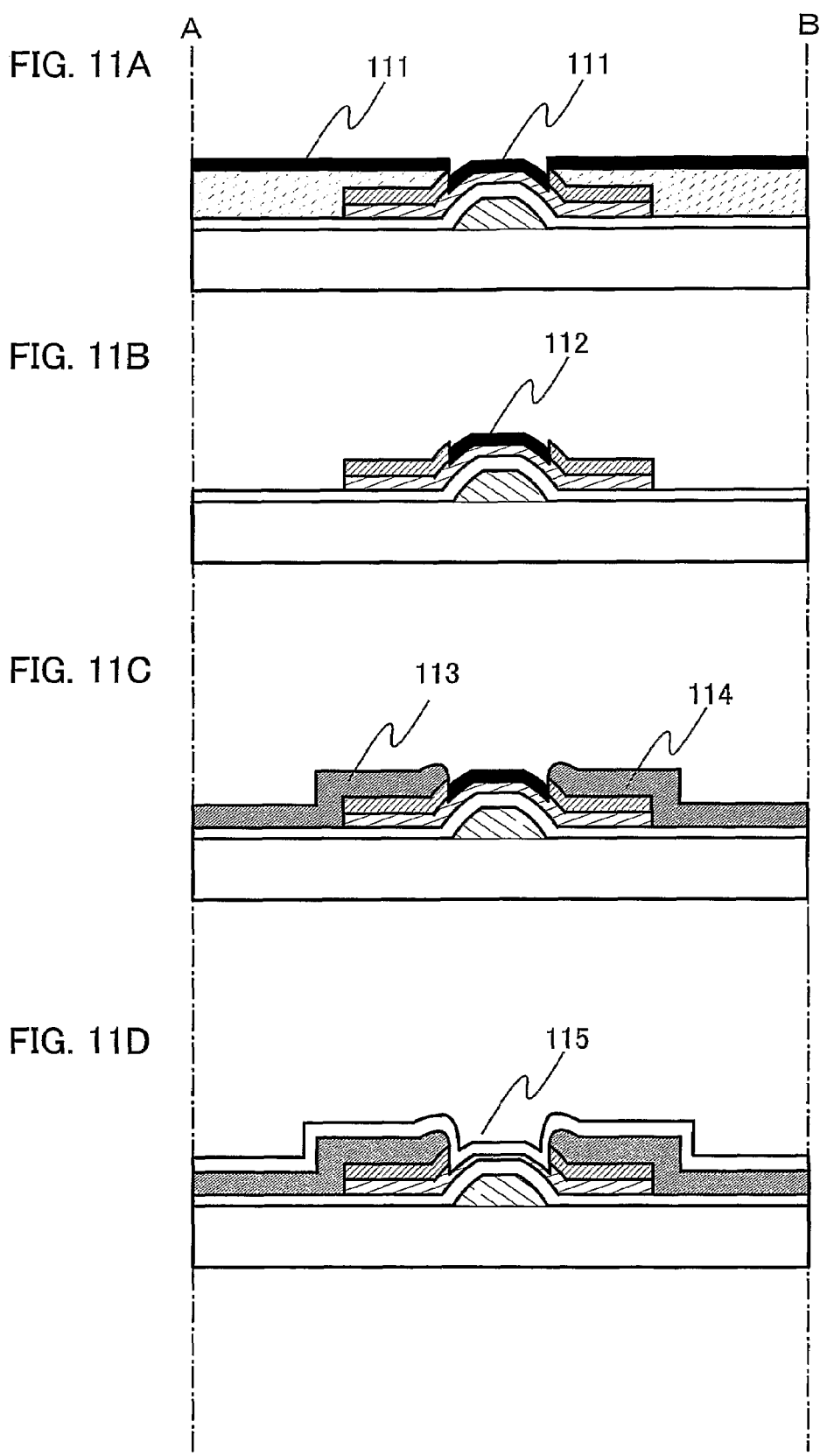

METHOD FOR MANUFACTURING THIN FILM TRANSISTOR

TECHNICAL FIELD

The present invention relates to a method for manufacturing a thin film transistor by using a droplet discharging method typified by an ink-jet method.

BACKGROUND ART

Conventionally, a so-called active matrix display panel including a thin film transistor (hereinafter, a TFT) formed over a glass substrate has been manufactured by patterning various kinds of thin films in an exposure step using a photomask in the same manner as a technique for manufacturing a semiconductor integrated circuit.

More specifically, a thin film pattern of a TFT has been formed as follows. After resist is applied over an entire surface of a substrate and the substrate is temporarily baked, the substrate is subjected to a photolithography step, wherein the substrate is irradiated with ultraviolet ray or the like through a mask pattern and developed to form a resist pattern. Subsequently, by utilizing the resist pattern as a mask, a film existing in a portion to be a thin film pattern (e.g., a thin film made from a semiconductor material, an insulating material or a conductive material), a semiconductor thin film, a metal thin film and the like are removed by etching so that the thin film pattern can be obtained.

Increasing the size of a substrate makes it impossible to process an entire surface of a display panel at once by one exposure treatment. As a result, following methods and the like have been developed. A region applied with photoresist is divided into plural parts and an exposure treatment is carried out for each predetermined block region continuously. Or, in the case of a small display panel, an entire surface of a substrate can be patterned relatively easily by using an exposure device (for example, see patent document 1).

[Patent Document 1] Japanese Patent Application Laid-Open No. Hei 11-326951

Therefore, in order to reduce cost of equipment and simplify process, it is examined that a droplet discharging device is used for forming a thin film or a pattern of a wiring of a TFT in manufacturing a semiconductor device that includes a TFT.

Further, in order to improve the yield of a liquid used for forming a film, a technique for forming a film over a semiconductor wafer by using an apparatus that can continuously discharge resist into a linear shape through a nozzle is disclosed in patent document 2.

[Patent Document 2] Japanese Patent Application Laid-Open No. 2000-188251

DISCLOSURE OF INVENTION

However, to form a microscopic TFT, high alignment accuracy, e.g., a gap between a source wiring and a drain wiring or a positional relation of a mask for etching a semiconductor layer containing an impurity of one conductivity type, a gate electrode layer, a source wiring and a drain wiring, is required. When forming a TFT by using a droplet discharging device, sufficient alignment accuracy is not obtained due to problems caused by the insufficient accuracy of a liquid discharging position for the device or the spread of the liquid after being discharged. In addition, further improved alignment accuracy is required in accordance with the miniaturization of a TFT.

In view of the above problems, it is an object of the invention to provide a method for manufacturing a microscopic TFT regardless of accuracy of a discharging position for a droplet discharging device.

In an aspect of the present invention, an organic resin film or the like is applied over a substrate and the organic resin film is processed into a predetermined shape by etch-back, exposure, development, and the like. A semiconductor layer containing an impurity of one conductivity type is processed by etching while utilizing the organic resin film with the predetermined shape as a mask. By utilizing the organic resin film with the predetermined shape, regions having different wettabilities are formed.

The conductivity type of the semiconductor layer containing the impurity of one conductivity type may be either an n-type or a p-type.

In another aspect of the invention, a gate electrode layer is formed, a gate insulating layer is formed over the gate electrode layer, and a semiconductor layer is formed over the gate insulating layer. A semiconductor layer containing an impurity of one conductivity type is formed over the semiconductor layer. A first mask is formed over the semiconductor layer containing the impurity of one conductivity type. By utilizing the first mask, the semiconductor layer and the semiconductor layer containing the impurity of one conductivity type are etched and then the first mask is removed. Subsequently, an organic resin film is applied. The organic resin film formed over the gate electrode layer is removed by etch-back, exposure, development, and the like so as to form an opening. The semiconductor layer containing the impurity of one conductivity type is etched while utilizing the organic resin film with the opening as a second mask. Subsequently, regions having different wettabilities are formed and a source wiring and a drain wiring are formed by the droplet discharging method.

In another aspect of the invention, a gate electrode layer is formed, a gate insulating layer is formed over the gate electrode layer, and a semiconductor layer is formed over the gate insulating layer. A protective layer is formed on the semiconductor layer and a semiconductor layer containing an impurity of one conductivity type is formed on the protective layer. A first mask is formed over the semiconductor layer containing the impurity of one conductivity type. By utilizing the first mask, the semiconductor layer and the semiconductor layer containing the impurity of one conductivity type are etched and then the first mask is removed. Subsequently, an organic resin film is applied. The organic resin film formed over the gate electrode layer is removed by etch-back, exposure, development, and the like so as to form an opening. The semiconductor layer containing the impurity of one conductivity type is etched while utilizing the organic resin film with the opening as a second mask. Subsequently, regions having different wettabilities are formed and a source wiring and a drain wiring are formed by the droplet discharging method.

In another aspect of the invention, a source wiring and a drain wiring are formed over a substrate. A semiconductor layer containing an impurity of one conductivity type is formed over the source and drain wirings. A first mask is formed over the semiconductor layer containing the impurity of one conductivity type. By utilizing the first mask, the semiconductor layer containing the impurity of one conductivity type is etched and then the first mask is removed. A semiconductor layer is formed over the semiconductor layer containing the impurity of one conductivity type and a second mask is formed over the semiconductor layer. By utilizing the second mask, the semiconductor layer containing the impurity of one conductivity type and the semiconductor layer are etched and then the second mask is removed. Subsequently, a gate insulating layer is formed over the semiconductor layer. An organic resin film or the like is applied to the surface of the gate insulating film. The organic resin film is exposed and developed from a rear surface of the substrate. Afterwards, regions having different wettabilities are formed and a gate electrode layer is formed by the droplet discharging method.

According to the present invention, a gap between a source wiring and a drain wiring, a positional relation of a mask for etching a semiconductor layer containing an impurity of one conductivity type, a gate electrode layer, the source wiring and the drain wiring, and the like may be determined in a self-aligning manner. Therefore, a microscopic TFT may be manufactured regardless of the accuracy of a discharging position for a droplet discharging device.

Furthermore, a microscopic TFT may be manufactured by the droplet discharging method, thereby reducing cost of equipment and simplifying process. As a consequence, an inexpensive semiconductor device can be manufactured.

BRIEF DESCRIPTION OF DRAWINGS

FIGS. 1A to 1D are cross sectional views explaining steps of manufacturing a thin film transistor according to the invention;

FIGS. 6A to 6D are cross sectional views explaining steps of manufacturing a thin film transistor according to the invention;

FIGS. 10A to 10D are cross sectional views explaining steps of manufacturing a thin film transistor according to the invention;

FIGS. 11A to 11D are cross sectional views explaining steps of manufacturing a thin film transistor according to the invention;

BEST MODE FOR CARRYING OUT THE INVENTION

Figure 2A:
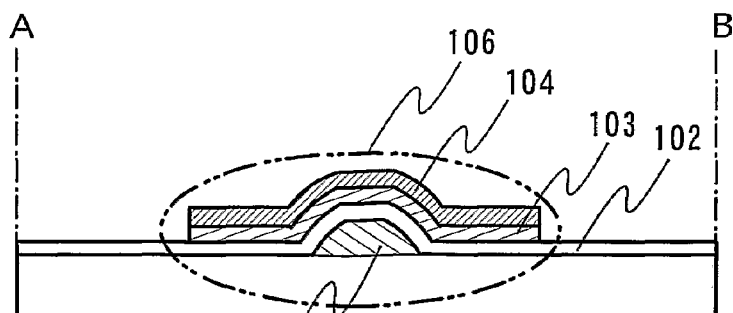
FIGS. 2A to 2D are cross sectional views explaining steps of manufacturing a thin film transistor according to the invention.

The embodiment modes according to the present invention will hereinafter be described referring to the accompanying drawings. The present invention can be carried out in many different modes, and it is easily understood by those who skilled in the art that embodiment modes and details herein disclosed can be modified in various ways without departing from the purpose and the scope of the invention. The present invention should not be interpreted as being limited to the description of the embodiment mode to be given below. Further, same reference numerals indicate same portions throughout the drawings, and will no be further explained.

The steps of manufacturing a TFT according to the invention will be described below.

Embodiment Mode 1

A method for manufacturing a channel-etched TFT using etch-back will be described in Embodiment Mode 1.

Figure 3:
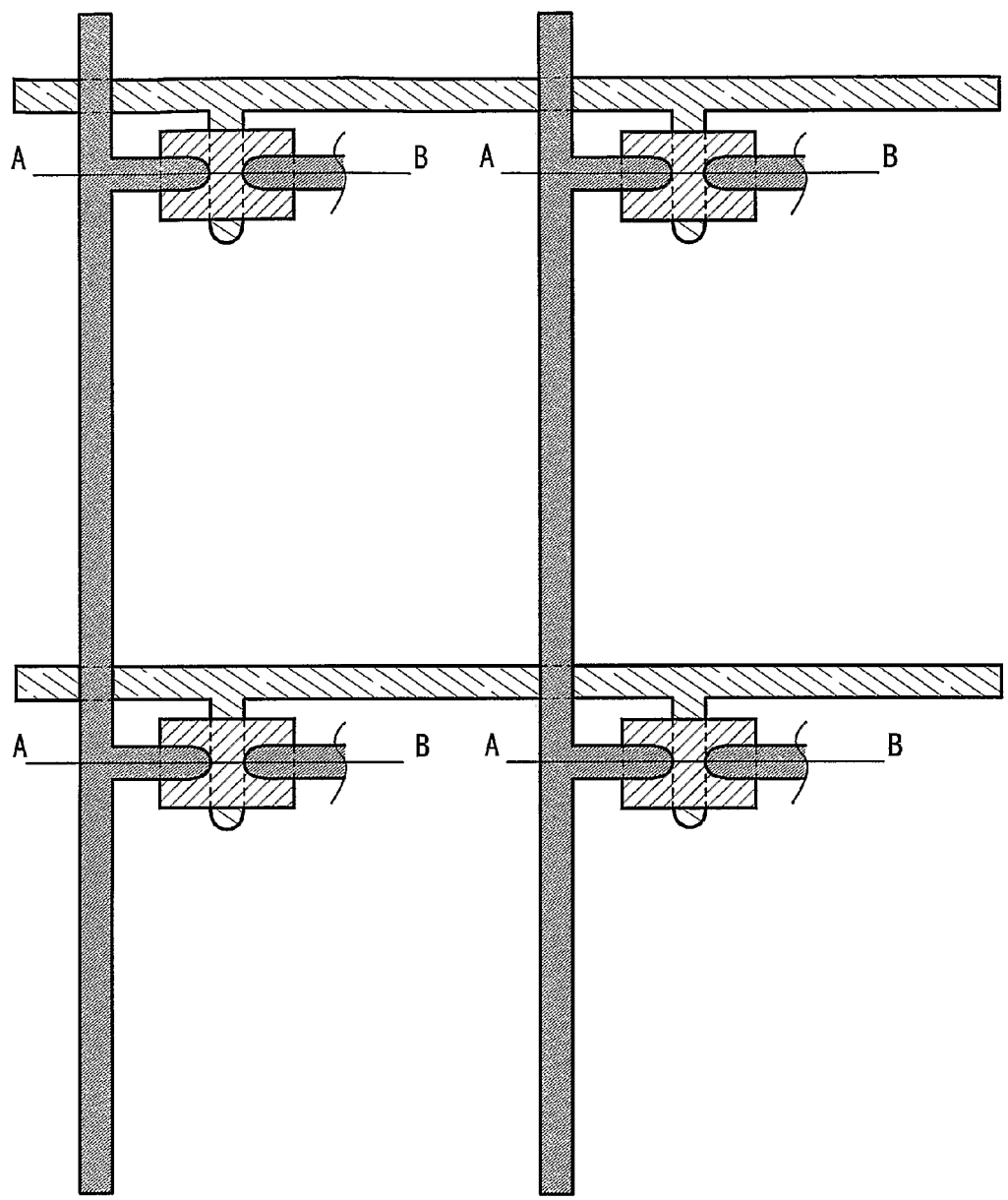
FIG. 3 is a top view explaining a structure of a thin film transistor according to the invention.

FIG. 1A shows a step of forming a gate electrode layer over a substrate 100. FIG. 1A schematically illustrates a longitudinal cross sectional structure while FIG. 3 illustrates a plane structure corresponding to a line A-B of FIG. 1A.

The substrate 100 can be made from an alkali-free glass substrate manufactured by the fusion method or the floating method such as barium borosilicate glass, alumino borosilicate glass and alumino silicate glass, a ceramic substrate, and a heat resistant plastic substrate that can withstand a processing temperature of the present manufacturing process, and the like. Also, a semiconductor substrate such as single crystalline silicon, a metal substrate such as stainless with an insulating layer on its surface may be employed. As the substrate 100, a large size substrate with an area of, e.g., 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm can be used.

A gate electrode layer 101 is formed over the substrate 100 by discharging a composition containing a conductive material by the droplet discharging method. As the conductive material for forming the layer, metals such as Ag, Au, Cu, Ni, Pt, Pd, Ir, Rh, W, Al, Ta, Mo, Cd, Zn, Fe, Ti, Si, Ge, Zr and Ba, fine particles of silver halide or dispersant nanometer-size particles can be used. In addition, ITO (indium tin oxide), ITO containing silicon oxide as a composition, organic indium, organic tin, zinc oxide (ZnO), titanium nitride (TiN) and the like, which are generally used as a transparent conductive layer, can be employed. In order to reduce resistivity, a solvent in which any one of gold, silver and copper is dissolved or dispersed is preferably used in view of a specific resistance value. More preferably, low-resistive silver or copper is used. In addition, a barrier film is preferably used in combination with silver or copper so as to prevent an impurity. When using copper as a wiring, the barrier film may be formed of an insulating or a conductive substance containing nitrogen such as silicon nitride, silicon oxynitride, aluminum nitride, titanium nitride and tantalum nitride (TaN). The barrier film may be formed by the droplet discharging method. The solvent corresponds to an organic solvent or the like. As the organic solvent, ester such as butyl acetate, alcohol such as isopropyl alcohol and ketone such as acetone are given. The surface tension and the viscosity are arbitrarily adjusted by controlling the concentration of the solution or by adding a surfactant and the like. The conductive layer is formed by stacking conductive fine particles three-dimensionally and irregularly. That is, the conductive layer includes three-dimensional aggregate particles. Therefore, the surface thereof is slightly uneven. Also, the diameter of fine particles is increased by baking the particles, and therefore, the conductive layer has a rough surface. Further, a binder formed of an organic substance remains in the conductive layer depending on a heating temperature, an atmosphere and times.

A base film may be formed over the substrate 100 such that the gate electrode layer is well-adhered to the substrate. The base layer may be formed of a metal material such as Ti (titanium), W (tungsten), Cr (chromium), Ta (tantalum), Ni (nickel) and Mo (molybdenum), or oxide thereof by sputtering, vapor deposition, or the like. The base layer may be formed to have a thickness of 100 nm or less. Since the base layer is preferably formed as thin as possible, the base layer may not be necessary to have a layer structure. The base layer can be eliminated if the gate electrode layer is well-adhered to the substrate. In addition, atmospheric pressure plasma processing may be performed. Besides the present step, when a conductive layer is formed over an organic layer, an inorganic layer, a metal layer or the like by the droplet discharging method or when an organic layer, an inorganic layer, a metal layer or the like is formed over a conductive layer that is formed by the droplet discharging method, a base layer may be provided such that each conductive layer is well-adhered thereto.

The viscosity of a composition used for the droplet discharging method is preferably set to be 5 to 20 mPa·s or less. This may prevent the composition from being dried so that the composition can be discharged through a discharge port smoothly. The surface tension is preferably set to be about 20 to 50 mN/m. The viscosity or the like of the composition is preferably adjusted in accordance with a solvent to be used or an intended purpose. For example, the viscosity of a composition in which ITO, ITO containing silicon oxide, organic indium or organic tin is dissolved or dispersed in a solvent is set to be 5 to 20 mPa·s; the viscosity of a composition in which silver is dissolved or dispersed in a solvent, 5 to 20 mPa·s; and a composition in which gold is dispersed in a solvent, 10 to 20 mPa·s.

The diameter of a conductive particle is preferably as small as possible to prevent a clogged nozzle or fabricate a microscopic pattern, though it is dependent on the diameter of each nozzle or a pattern shape. Preferably, the diameter of the conductive particle is 0.1 µm or less. The composition is formed by a known method such as electrolyzing, atomizing and wet reducing. The particle size thereof is typically about 0.5 to 10 µm. In the case of using a gas evaporation method, each nanometer-size molecular protected with a dispersing agent is extremely fine and is about 7 nm in size. Further, when each surface of the nanometer-size particles is covered with a coating agent, the nanometer-size particles are not aggregated in a solvent but are uniformly dispersed in the solvent at a room temperature, and show a property similar to that of a liquid. Therefore, the coating agent is preferably used.

The step of discharging the composition may be carried out under reduced pressure. When the step for discharging the composition is performed under reduced pressure, a solvent of the composition is vaporized during a period from discharging the composition till attaching it to an object to be processed. Consequently, steps for drying and baking, which should be performed later, can be both eliminated or shortened. After discharging the solution, one or both of a drying step and a baking step is/are performed under normal pressure or reduced pressure by using laser irradiation, rapid thermal annealing, heating furnace or the like depending on a kind of the solution. The both steps for drying and baking are steps of a heat treatment. For example, the drying is performed for 3 minutes at a temperature of 100° C. whereas the baking is performed for 15 to 120 minutes at temperatures from 200 to 350° C.; therefore the purposes, temperatures and times thereof are varied. The substrate may be heated in advance so as to carry out the steps for drying and baking favorably. At this time, although the heating temperature depends on a material of the substrate and the like, it is generally set to 100 to 800° C. (preferably, 200 to 350° C.). In this step, the solvent in the solution is vaporized or the dispersing agent is chemically removed and peripheral resin is cured and contracted so that fusing and welding are accelerated. This step is carried out under an oxygen atmosphere, a nitrogen atmosphere or atmospheric air. Preferably, this step is carried out under the oxygen atmosphere such that the solvent in which a metal element is dissolved or dispersed is easily removed.

Figure 15:
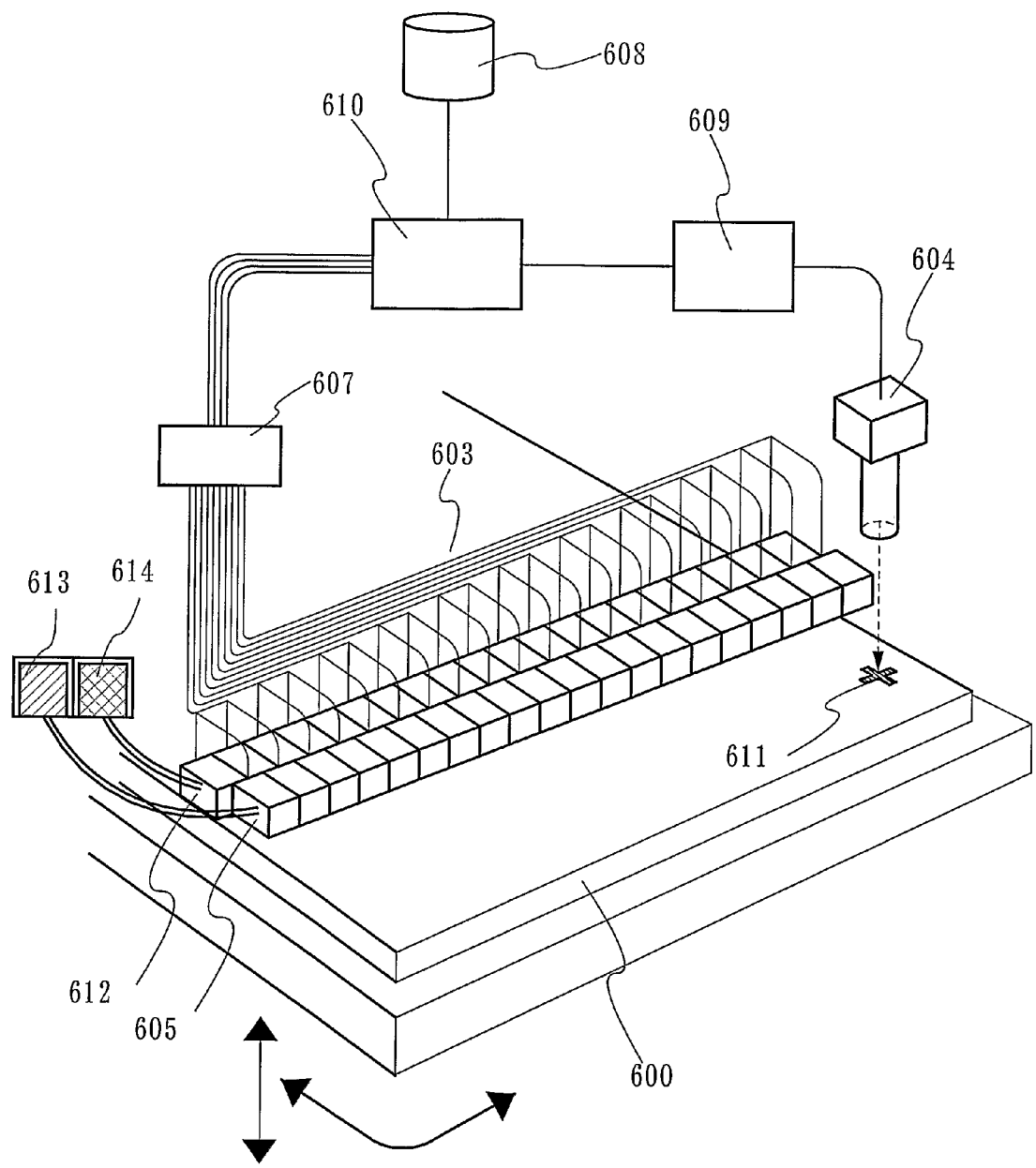
FIG. 15 is a diagram showing a structure of a droplet discharging device that is applicable to the present invention.

One mode of a droplet discharging device used for forming a pattern is illustrated in FIG. 15. Respective heads 605 and 612 of a droplet discharging device 603 are connected to a controlling means 607. By controlling the respective heads using a computer 610, a predetermined pattern that is programmed in the computer in advance can be written. For example, a position of wiring the pattern may be determined with reference to a marker 611 provided over a substrate 600. Alternatively, the edge of the substrate 600 may be determined as a reference point. Information about the marker 611 is detected by imaging means 604 such as an image sensor utilizing a charge-coupled device (CCD) or a complementary metal-oxide semiconductor (CMOS) and converted into a digital signal by image processing means 609. When the digital signal is recognized by the computer 610, a control signal is generated and sent to the controlling means 607. Of course, information of the pattern to be formed over the substrate 600 is stored in a recording medium 608. The control signal is sent to the controlling means 607 based on the information about the pattern so that the heads 605 and 612 of the droplet discharging means 603 can be controlled individually. A discharging material is supplied to the heads 605 and 612 from material supply sources 613 and 614 through piping. A device capable of discharging a metal material, an organic material and an inorganic material individually through one head may be used such that respective colors of R, G and B can be discharged through one ink-jet head like an electroluminescent (EL). Therefore, when forming an interlayer insulating layer by the droplet discharging device, thin lines may be multiply-layered by using a same material so as to improve the throughput. Although the longitudinal length of the heads 605 and 612 arranged in parallel of the droplet discharging means 603 corresponds to the width of the substrate in FIG. 15, the droplet discharging device can form a pattern over a large size substrate having a width larger than the longitudinal length of the heads 605 and 612 by scanning the heads repeatedly. In this case, the heads 605 and 612 can be scanned freely in directions denoted by arrows in FIG. 15 so that a region to be written can be freely set. Accordingly, a plurality of same patterns can be written over a substrate.

The gate electrode layer is formed by the droplet discharging method in the present embodiment mode, however, it may be formed by plasma CVD or sputtering.

When forming a conductive base layer, any one of the following two steps is preferably carried out for treating the exposed base layer.

A first method is a step for insulating the base layer that is not overlapped with the gate electrode layer. Concretely, the base layer, which is not overlapped with the gate electrode layer, is oxidized to be insulated. When the base layer is oxidized to be insulated, the base layer is preferably formed with a thickness of 10 nm or less. This can oxidize the base layer easily. As the method for oxidizing the base layer, either a method for exposing it under an oxygen atmosphere or a method for performing a heat treatment can be employed.

A second method is a step for removing the base layer by etching by utilizing the gate electrode layer as a mask. When employing this step, the thickness of the base layer is not limited.

Next, a gate insulating layer 102 is formed to have a single layer or a lamination structure by plasma CVD or sputtering (see FIG. 1B). As a preferable mode, the gate insulating layer is formed by laminating an insulating layer made from silicon nitride, an insulating layer made from silicon oxide and another insulating layer made from silicon nitride. In order to form a dense insulating layer with low gate leakage current at a low temperature, a reaction gas added with a rare gas element such as argon may be mixed in an insulating layer to be formed. By forming a first layer contacting to the gate electrode layer 101 using silicon nitride or silicon nitride oxide, deterioration due to oxidation can be prevented. Further, by using NiB (nickel boron) as a first layer contacting to the gate electrode layer 101, a surface thereof can be smoothed.

Subsequently, a semiconductor layer 103 is formed. As a material for forming the semiconductor layer 103, an amorphous semiconductor (hereinafter, AS), which is manufactured by using a semiconductor material gas typified by silane or germane by the vapor growth method or sputtering, a polycrystalline semiconductor, which is formed by crystallizing the amorphous semiconductor by utilizing light energy or heat energy, a semiamorphous (also referred to as microcrystalline) semiconductor (hereinafter, SAS), or the like can be employed. Additionally, an organic semiconductor can be used.

The SAS has an intermediate structure between an amorphous structure and a crystalline structure (including a single crystalline structure and a polycrystalline structure), and a third condition that is stable in term of free energy. The SAS further includes a crystalline region having a short range order along with lattice distortion. A crystal region with a size of 0.5 to 20 nm can be observed in at least a part of a semiamorphous semiconductor film. In the case of containing silicon as its principal constituent, Raman spectrum is shifted toward lower wavenumbers than 520 cm$^{-1}$. The diffraction peaks of (111) and (220), which are believed to be derived from silicon crystal lattice, are observed in the SAS by X-ray diffraction. The SAS contains hydrogen or halogen of at least 1 atom % or more to terminate dangling bonds. The SAS is formed by glow discharge decomposition (plasma CVD) with silicide gas. As for the silicide gas, $SiH_4$, $Si_2H_6$, $SiH_2Cl_2$, $SiHCl_3$, $SiCl_4$, $SiF_4$ and the like can be used. The silicide gas may be mixed with $GeF_4$. The silicide gas may also be diluted with $H_2$, or a mixture of $H_2$ and one or more of rare gas elements selected from He, Ar, Kr and Ne. In addition, the silicide gas may also be diluted with $F_2$, or a mixture of $F_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less. With respect to impurity elements contained in the film, each concentration of impurities for atmospheric constituents such as oxygen, nitrogen and carbon is preferably set to be $1 \times 10^{20}/cm^3$ or less. In particular, the oxygen concentration is set to be $5 \times 10^{19}/cm^3$ or less, preferably, $1 \times 10^{19}/cm^3$ or less.

A crystalline semiconductor layer can be formed by crystallizing an amorphous semiconductor layer or an SAS by heating or laser irradiation. Alternatively, a crystalline semiconductor layer may be formed directly. In this case, the crystalline semiconductor layer can be directly formed by using fluorine gas such as $GeF_4$ and $F_2$ and silane gas such as $SiH_4$ and $Si_2H_6$ and utilizing heat or plasma.

When using plasma CVD, an AS is formed by using a semiconductor material gas such as $SiH_4$ and a mixture gas of $SiH_4$ and $H_2$. When using a mixture gas in which $SiH_4$ is diluted 3 to 1,000 times with $H_2$ or when using a mixture gas in which $Si_2H_6$ and $GeF_4$ are diluted at a rate of 20 to 40:0.9, an SAS with a composition ratio of Si for 80% or more can be obtained. In particular, the latter case is preferable since the crystallinity can be imparted to the semiconductor layer 103 from the interface of the base film. Alternatively, a mixture gas of $SiH_4$ and $F_2$ may be employed.

Next, a semiconductor layer 104 containing an impurity of one conductivity type is formed over the semiconductor layer 103. The semiconductor layer 104 containing the impurity of one conductivity type may be formed by using silane gas and phosphine gas and made from the AS or the SAS.

A mask 105 is next formed over the semiconductor layer 104 containing the impurity of one conductivity type by the droplet discharging method. By utilizing the mask 105, the semiconductor layer 104 containing the impurity of one conductivity type and the semiconductor layer 103 are etched (see FIGS. 1C and 1D).

A resin material such as epoxy resin, acrylic resin, phenol resin, novolac resin, melamine resin and urethane resin is used as the mask 105. Alternatively, the mask may also be made from an organic material such as benzocyclobutene, parylene, flare and polyimide having a light transmitting property; a material including a compound formed by polymerization such as a siloxane polymer; a material containing a water-soluble homopolymer and a water-soluble copolymer; and the like by using the droplet discharging method. In addition, a commercially available resist material containing a photosensitive agent may be also used. For example, it is possible to use a typical positive resist including a novolac resin and a naphthoquinonediazide compound that is a photosensitive agent; a negative resist including base resin, diphenylsilanediol, and an acid generating material, and the like. The surface tension and the viscosity of any material are appropriately adjusted by controlling the solvent concentration or by adding a surfactant, etc.

Subsequently, the mask 105 is removed to form a semiconductor region 106 (see FIG. 2A).

Figure 2B:
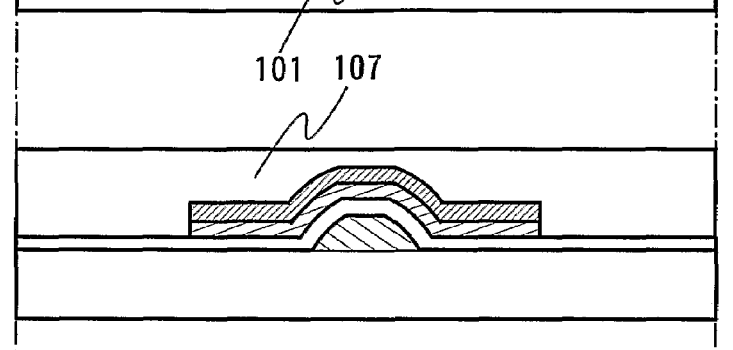

Next, a planarizing film 107 is applied (see FIG. 2B). As a material for the planarizing film 107, the following materials can be cited: a resin material such as epoxy resin, acrylic resin, phenol resin, novolac resin, melamine resin and urethane resin; an organic material such as benzocyclobutene, parylene, flare, and polyimide having a light transmitting property; a material including a compound formed by polymerization such as a siloxane polymer; a material containing a water-soluble homopolymer and a water-soluble copolymer; and the like. In addition, a commercially available resist material containing a photosensitive agent may be also used. For example, it is possible to use a typical positive resist including a novolac resin and a naphthoquinonediazide compound that is a photosensitive agent; a negative resist including base resin, diphenylsilanediol, and an acid generating material, and the like. The surface tension and the viscosity of any material are appropriately adjusted by controlling the solvent concentration or by adding a surfactant, etc.

Figure 2C:
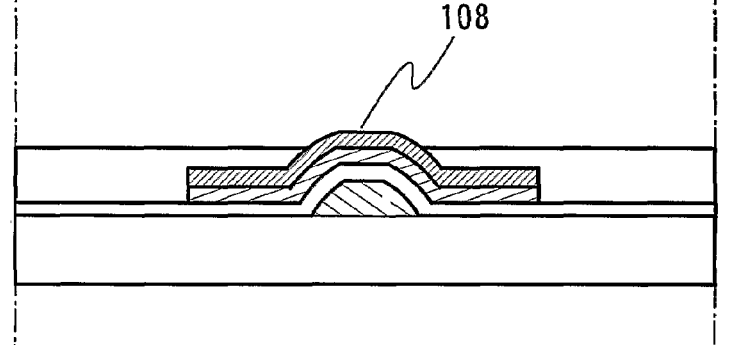

Etch-back is performed to the planarizing film 107. Since the gate electrode layer 101 is formed over the substrate, the thickness of the planarizing film over the gate electrode layer 101 becomes thin (see FIG. 2B). Therefore, the planarizing film over a channel portion 108 can be only and selectively removed by etch-back (see FIG. 2C).

Figure 2D:
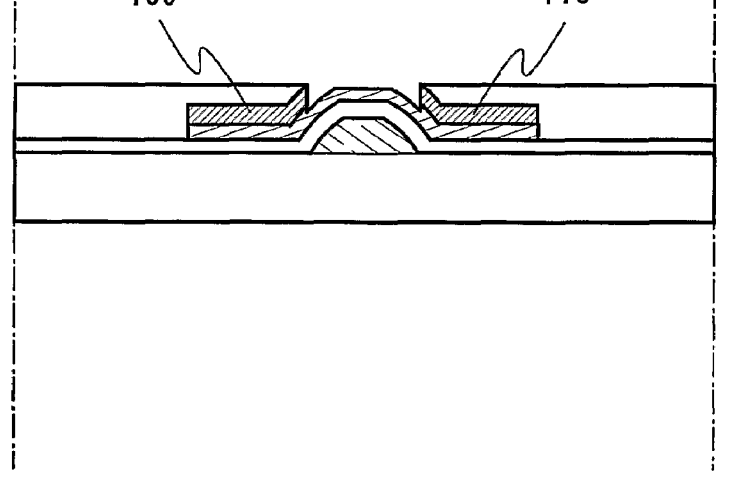

By utilizing the remaining planarizing film as a mask, the semiconductor layer 104 containing the impurity of one conductivity type is etched to form semiconductor layers 109 and 110 containing the impurity of one conductivity type (see FIG. 2D). Accordingly, the mask for etching the semiconductor layer containing the impurity of one conductivity type is formed in a self-aligning manner and used.

When the semiconductor layer is formed of the SAS, it can be take a structure capable of driving a TFT at high speed in which a gate electrode is covered with a source region and a drain region; a so-called self-aligning structure in which edges of a source region and a drain region correspond to an edge of a gate electrode; or a structure with an effect of reducing off-current in which a source region and a drain region are formed individually with a certain interval without overlapping a gate electrode.

Next, regions of different wettabilities are formed. The difference in wettability indicates a relative relation between a subject region and a non-subject region. The both regions may have difference in wettability with respect to a material to be formed within a subject region. The regions of different wettabilities are regions in which contact angles with respect to the material to be formed are different from each other. A region having a larger contact angle with respect to the material becomes a region with lower wettability (hereinafter, a region with low wettability) whereas a region having a smaller contact angle with respect to the material becomes a region with higher wettability (hereinafter, a region with high wettability). When a region has a large contact angle, a liquid composition having liquidity does not spread on a surface of the region; therefore, the surface thereof does not get wet. Alternatively, when a region has a small contact angle, a liquid composition having liquidity spreads on a surface of the region so that the surface thereof gets wet. In the present invention, the difference in the contact angles between the regions of different wettabilities is 30° or more, preferably, 40° or more.

Figure 4A:
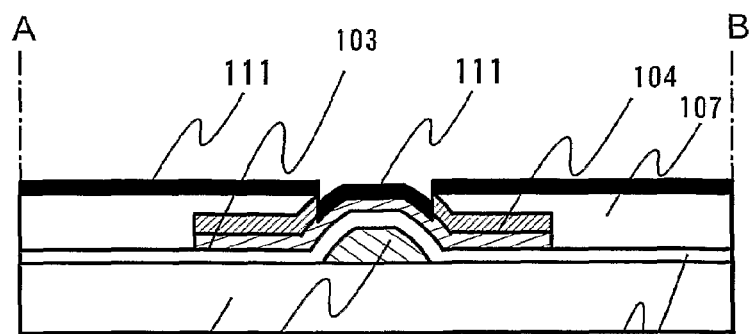
FIGS. 4A to 4D are cross sectional views explaining steps of manufacturing a thin film transistor according to the invention.

First, a solution for forming the region with low wettability is discharged or applied (see FIG. 4A). As an example of a composition for a solution used for forming the region with low wettability, a silane coupling agent denoted by a chemical formula: $R_n$—Si—$X_{(4-n)}$ (n=1, 2, 3) is used. In the chemical formula, R represents a substance containing a relatively inactive group such as alkyl group. Further, X represents a substituent which can be hydrolysated by condensation and bonding to a hydroxyl group existing on a substrate surface or absorbed water such as a halogen group, a methoxy group, an ethoxy group and an acetoxy group.

As a representative example of the silane coupling agent, in the case of using a fluorine silane coupling agent (such as fluoroalkylsilane (FAS)) that has a fluoroalkyl group as R, the wettability can be further reduced. R in the FAS has a structure expressed by $(CF_3)(CF_2)_x(CH_2)_y$ (x is an integer in a range of 0 to 10, and y is an integer in a range of 0 to 4). When a plurality of Rs or Xs are bound to Si, the Rs or Xs may be same or different from one another. Typically, fluoroalkylsilane (hereinafter, FAS) such as: heptadecafluoro tetrahydrodecyl triethoxysilane; heptadecafluoro tetrahydrodecyl trichlorosilane; tridecafluoro tetrahydrooctyl trichlorosilane; and trifluoropropyl trimethoxysilane can be cited.

As a solvent of a solution for forming the region with low wettability, a hydrocarbon solvent such as n-pentane, n-hexane, n-heptane, n-octane, n-decane, dicyclopentane, benzene, toluene, xylene, durene, indene, tetrahydronaphthalene, decahydronaphthalene and squalane; tetrahydrofran; or the like can be used.

As an example of a composition of the solution for forming the region with low wettability, a material having fluorocarbon chain (e.g., fluorocarbon resin) can be used. As the fluorocarbon resin, the followings can be used: polytetrafluoroethylene (PTFE); perfluoroalkoxyalkane (PFA); perfluoro (ethylene propene) copolymer (PFEP); ethylene-tetrafluoroethylene copolymer (ETFE); poly(vinylidene fluoride) (PVDF); polychlorotrifluoroethylene (PCTFE); ethylene-chlorotrifluoroethylene copolymer (ECTFE); polytetrafluoroethylene-perfluorodioxole copolymer (TFE/PDD); poly(vinyl fluoride) (PVF); and the like.

Subsequently, the surface attached with the solution for forming the region with low wettability is washed to form an extremely thin surface 111 with low wettability.

The surface 111 with low wettability may also be formed by using a different method such as vapor deposition instead of discharging or applying the solution for forming the region with low wettability.

Figure 4B:
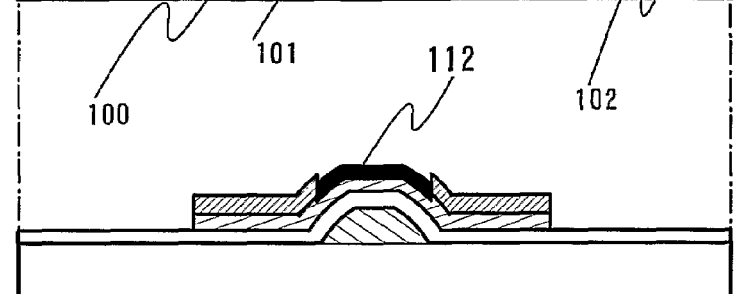

The remaining planarizing film is next removed by wet etching or the like. At this moment, the region with low wettability over the planarizing film is also removed by being lifted off so that the region with low wettability becomes to exist only on a channel portion 112 (see FIG. 4B).

Figure 4C:
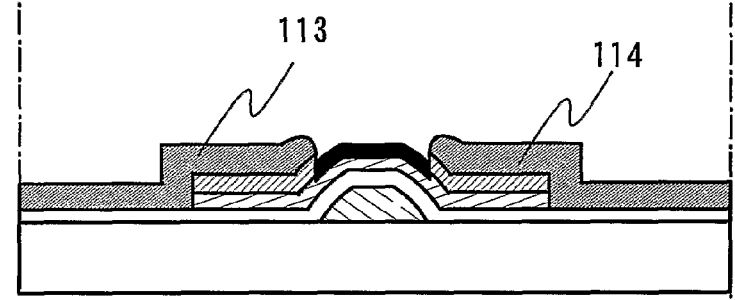

A composition containing a conductive material is next discharged selectively to form source and drain wirings 113 and 114 by the droplet discharging method (see FIG. 4C). At this moment, when the composition is discharged so as to sandwich the channel portion 112, a droplet discharged in the region with low wettability is not stabilized and moved to the regions with high wettability from boundaries between the region with low wettability and the regions with high wettability. Therefore, patterns can be selectively formed in the regions with high wettability so that positions of the source and drain wirings can be determined in a self-aligning manner. Also, a composition mainly containing a metal particle such as Ag (silver), Au (gold), Cu (copper), W (tungsten) and Al (aluminum) can be employed as the conductive material for forming these wirings. Additionally, light-transmitting indium tin oxide (ITO), ITSO including indium tin oxide and silicon oxide, organic indium, organic tin, zinc oxide, titanium nitride, and the like may be used in combination.

The extremely thin film forming the region 112 with low wettability is next removed by etching and the like.

A passivation layer 115 is preferably formed over the source and drain wirings 113 and 114. The passivation layer may be formed by using a method for forming a thin film such as plasma CVD and sputtering and by using silicon nitride, silicon oxide, silicon nitride oxide, silicon oxynitride, aluminum oxynitride, aluminum oxide, diamond like carbon (DLC), carbon nitride (CN), another insulating material or the like.

Figure 4D:
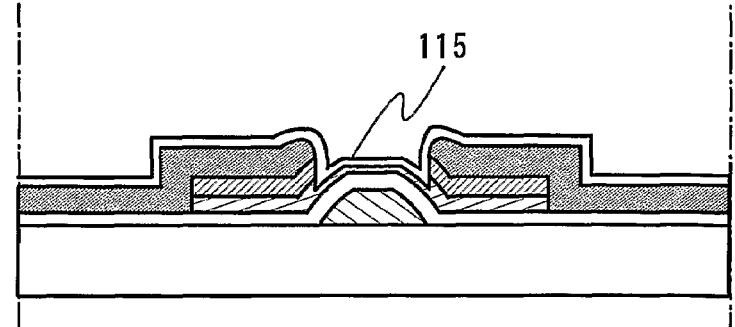

According to the above-described steps, a channel-etched TFT can be manufactured (see FIG. 4D).

Embodiment Mode 2

A method for manufacturing a channel stop TFT using etch-back will be described in Embodiment Mode 2.

Figure 5A:
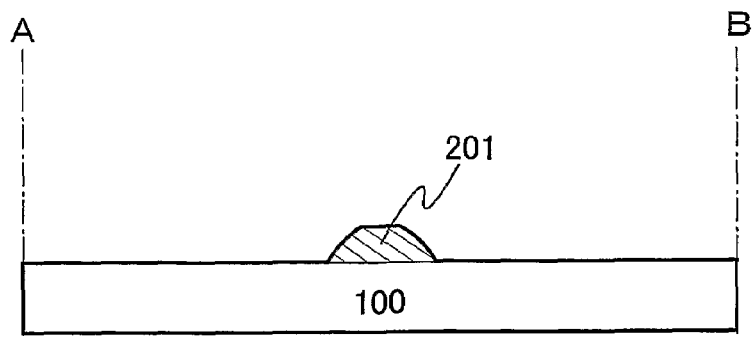
FIGS. 5A to 5D are cross sectional views explaining steps of manufacturing a thin film transistor according to the invention.

A composition containing a conductive material is discharged over a substrate 100 by the droplet discharging method to form a gate electrode layer 201 (see FIG. 5A). A gate insulating layer 202 including a single layer or a lamination structure is formed by plasma CVD or sputtering. As a particularly preferable mode, the gate insulating layer is formed by laminating three layers of an insulating layer made from silicon nitride, an insulating layer made from silicon oxide, and another insulating layer made from silicon nitride. A semiconductor layer 203 is next formed. The above-mentioned steps are identical to those of Embodiment Mode 1.

An insulating layer 204 is formed over the semiconductor layer 203 by plasma CVD or sputtering. As shown in the subsequent step, the insulating layer 204 remains over the semiconductor layer 203 in relation to the gate electrode layer so as to serve as a channel protection layer. The channel protection layer has advantageous effects of protecting a semiconductor layer containing an impurity of one conductivity type from damaging in etching and keeping an interface clean so as to prevent the semiconductor layer 203 from being contaminated with an impurity such as an organic material, metal and water vapor. Therefore, the insulating layer 204 is preferably made from a dense film. A silicon nitride film, which is made by glow discharge decomposition by using a silicide gas diluted 100-fold to 500-fold with a rare gas element such as argon, is preferable since it becomes a dense film under a deposition temperature of 100° C. or less. An insulating layer 204 may be formed by using a lamination structure, if necessary.

Figure 5B:
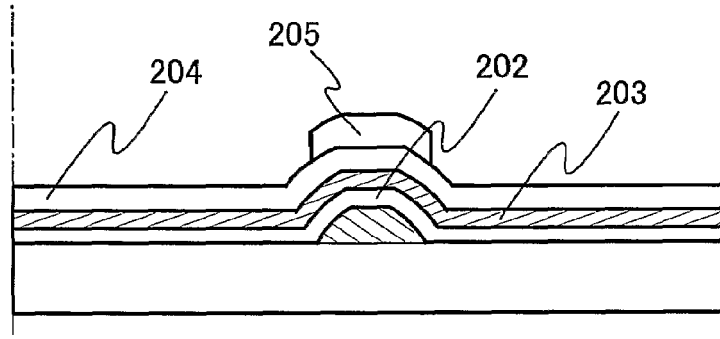

A composition is selectively discharged on the insulating layer 204 to form a mask 205 at a position corresponding to the gate electrode layer 201 (see FIG. 5B). A resin material such as epoxy resin, acrylic resin, phenol resin, novolac resin, melamine resin and urethane resin is used as the mask 205. Alternatively, the mask may also be made from an organic material such as benzocyclobutene, parylene, flare and polyimide having a light transmitting property; a material including a compound formed by polymerization such as a siloxane polymer; a material containing a water-soluble homopolymer and a water-soluble copolymer; and the like by using the droplet discharging method. In addition, a commercially available resist material including a photosensitive agent may be also used. For example, it is possible to use a typical positive resist including a novolac resin and a naphthoquinonediazide compound that is a photosensitive agent; a negative resist including base resin, diphenylsilanediol, and an acid generating material, and the like. The surface tension and the viscosity of any material are appropriately adjusted by controlling the solvent concentration or by adding a surfactant, etc.

Figure 5C:
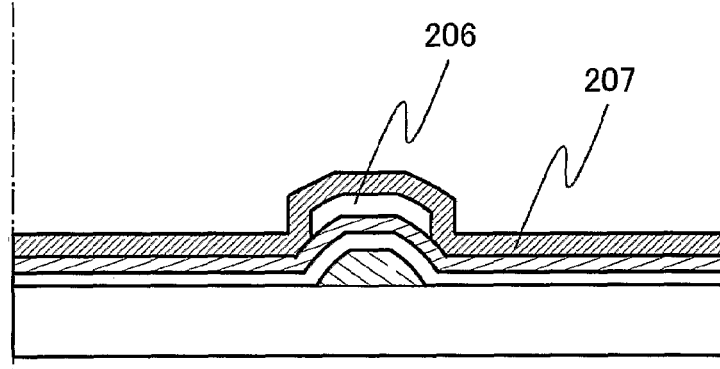

By utilizing the mask 205, the insulating layer 204 is etched to form an insulating layer 206 functioning as the channel protection layer (see FIG. 5C). The mask 205 is removed. A semiconductor layer 207 containing an impurity of one conductivity type is formed over the semiconductor layer 203 and the insulating layer 206. The semiconductor layer 207 containing the impurity of one conductivity type may be made from silane gas and phosphine gas and can be formed of an AS or an SAS.

The subsequent steps are identical to those of Embodiment Mode 1.

Figure 5D:
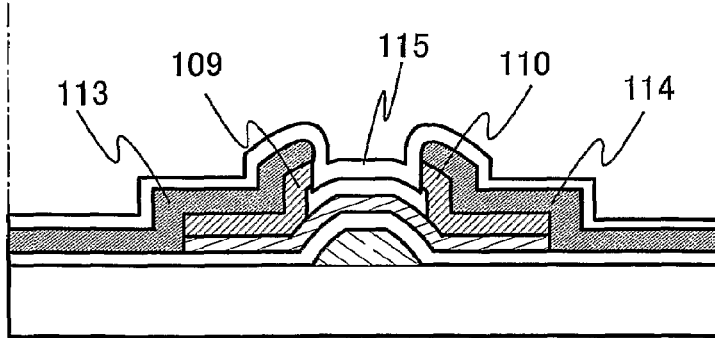

According to the above-mentioned steps, a channel stop TFT can be manufactured (see FIG. 5D).

Embodiment Mode 3

A method for manufacturing a channel-etched TFT using an exposure step of a rear surface will be described in Embodiment Mode 3.

FIG. 6A shows a step of forming a gate electrode layer over a substrate 100. FIG. 6A illustrates a schematic longitudinal sectional structure while FIG. 3 illustrates top plan structure corresponding to a line A-B.

A composition containing a conductive material is discharged over the substrate 100 by the droplet discharging method to form a gate electrode layer 301. Also, a base layer made from a metal material such as Ti (titanium), W (tungsten), Cr (chromium), Ta (tantalum), Ni (nickel) and molybdenum (Mo) or oxide thereof may be formed on the substrate 100 by sputtering or vapor deposition such that the gate electrode layer is well-adhered to the substrate. When forming a conductive base layer, it is necessary that the base layer that is not overlapped with the gate electrode layer is oxidized to be insulated or removed by etching while utilizing the gate electrode layer as a mask.

A gate insulating layer 302 is next formed by plasma CVD or sputtering to have a single layer or a lamination structure (see FIG. 6B). In particular, the gate insulating layer 302 is preferably formed by laminating three layers of an insulating layer made from silicon nitride, an insulating layer made from silicon oxide and another insulating layer made from silicon nitride.

A semiconductor layer 303 is next formed. As a material for forming the semiconductor layer 303, an amorphous semiconductor (hereinafter, AS), which is manufactured by using a semiconductor material gas typified by silane or germane by the vapor growth method or sputtering; a polycrystalline semiconductor, which is formed by crystallizing the amorphous semiconductor by utilizing light energy or heat energy; a semiamorphous (also referred to as microcrystalline) semiconductor (hereinafter, SAS); or the like can be employed. Additionally, an organic semiconductor can be used.

A semiconductor layer 304 containing an impurity of one conductivity type is next formed over the semiconductor layer 303. The semiconductor layer 304 containing the impurity of one conductivity type may be formed by using silane gas and phosphine gas and can be formed of the AS or the SAS.

A mask 305 is formed over the semiconductor layer 304 containing the impurity of one conductivity type by the droplet discharging method. By utilizing the mask 305, the semiconductor layer 304 containing the impurity of one conductivity type and the semiconductor layer 303 are etched (see FIGS. 6C and 6D).

Figure 7A:
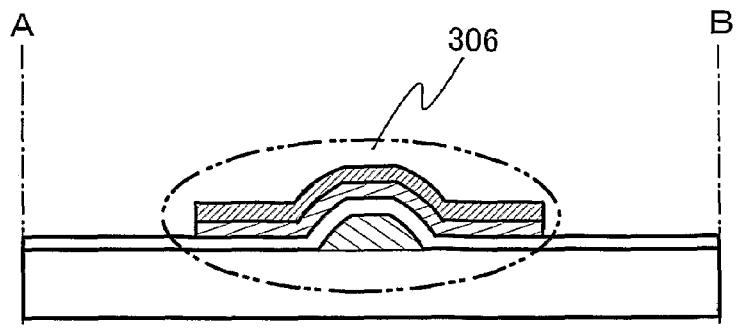
FIGS. 7A to 7D are cross sectional views explaining steps of manufacturing a thin film transistor according to the invention.

Subsequently, the mask 305 is removed so as to form a semiconductor region 306 (see FIG. 7A).

Figure 7B:
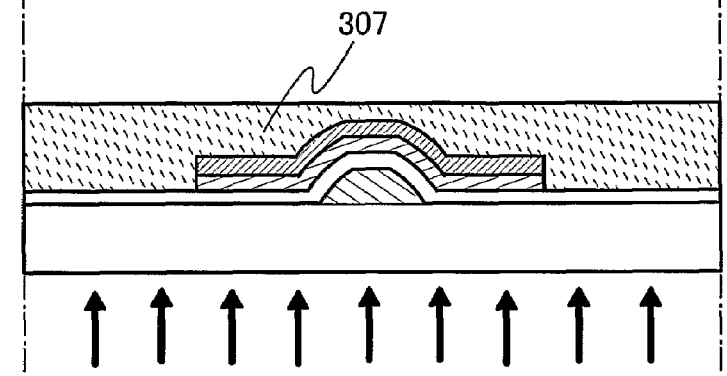

Next, resist 307 is applied (see FIG. 7B). As a material for the resist, a commercially available negative resist material containing a photosensitive agent may be employed. For example, it is possible to use a typical negative resist including base resin, diphenylsilanediol, and an acid generating material, and the like. The surface tension and the viscosity of any material are appropriately adjusted by controlling the solvent concentration or by adding a surfactant, etc.

Figure 7C:
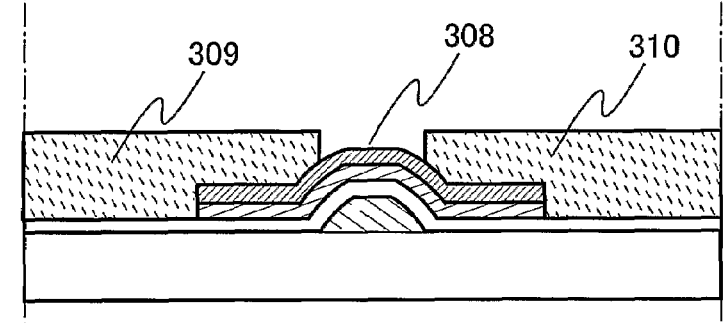

Next, the resist 307 is exposed from a rear surface of the substrate (see FIG. 7B). Since the gate electrode layer 301 exists over the substrate, the resist over the gate electrode layer 301 is not exposed. Therefore, the resist provided over a channel portion 308 can be only selectively removed by development (see FIG. 7C).

Figure 7D:
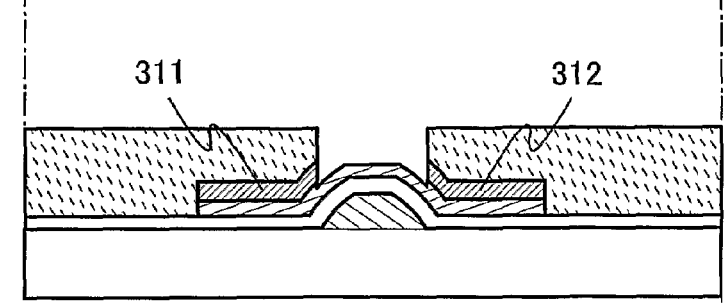

By utilizing remaining resist 309 and 310 as masks, the semiconductor layer 304 containing the impurity of one conductivity type is etched to form semiconductor layers 311 and 312 containing the impurity of one conductivity type (see FIG. 7D). Accordingly, the masks for etching the semiconductor layer containing the impurity of one conductivity type can be formed in a self-aligning manner and utilized.

Alternatively, a commercially available negative resist material containing a photosensitive agent may be employed as the mask 305. By utilizing the mask 305, the semiconductor layer 304 containing the impurity of one conductivity type and the semiconductor layer 303 are etched. Subsequently, the mask 305 is exposed from the rear surface of the substrate. Since the gate electrode layer 301 exists over the substrate, the mask containing the photosensitive agent over the gate electrode layer 301 is not exposed. Therefore, the mask provided over the channel portion 308 can be only selectively removed by development. By utilizing the remaining mask containing the photosensitive agent, the semiconductor layer 304 containing the impurity of one conductivity type may be etched to form semiconductor layers 311 and 312 containing the impurity of one conductivity type. In this case, the step of forming the resist 307 can be omitted.

Figure 8A:
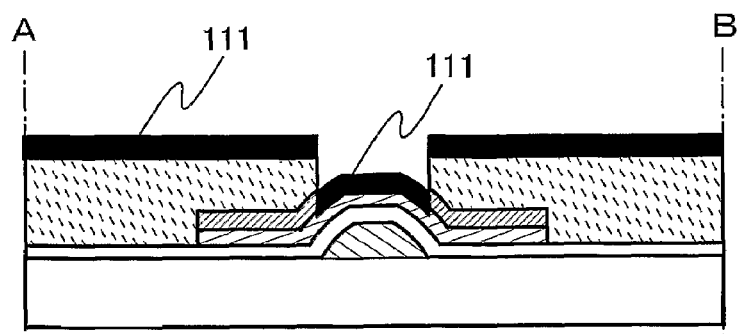
FIGS. 8A to 8D are cross sectional views explaining steps of manufacturing a thin film transistor according to the invention.
Figure 8B:
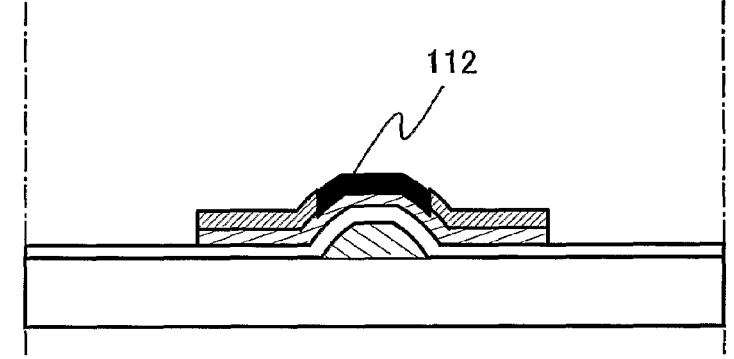
Figure 8C:
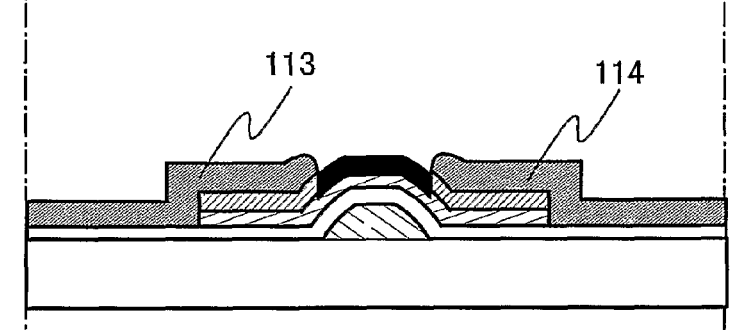

The subsequent steps are identical to those of Embodiment Mode 1 (see FIGS. 8A, 8B and 8C).

Figure 8D:
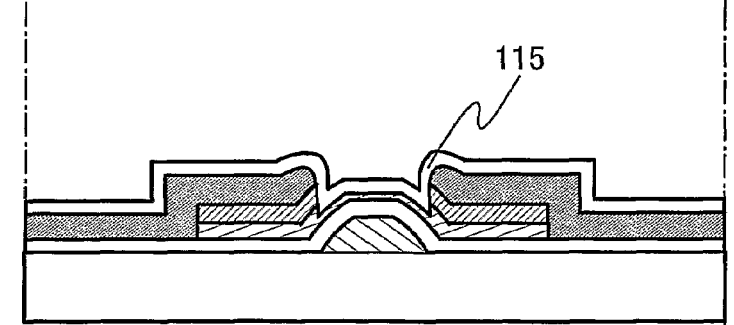

According to the above-described steps, a channel-etched TFT can be manufactured (see FIG. 8D).

Embodiment Mode 4

A method for manufacturing a channel stop TFT using exposure of a rear surface will be described in Embodiment Mode 4.

A composition containing a conductive material is discharged over a substrate 100 by the droplet discharging method to form a gate electrode layer 201. A gate insulating layer 202 is next formed by plasma CVD or sputtering to have a singe layer or a lamination structure. Preferably, the gate insulating layer is formed by laminating three layers of an insulating layer made from silicon nitride, an insulating layer made from silicon oxide and another insulating layer made from silicon nitride. A semiconductor layer 203 is next formed. The above steps are identical to those of Embodiment Mode 3.

An insulating layer 204 is formed over the semiconductor layer 203 by plasma CVD or sputtering. As shown in the subsequent step, the insulating layer 204 remains over the semiconductor layer in relation to the gate electrode layer so as to serve as a channel protection layer. The channel protection layer has advantageous effects of protecting a semiconductor layer containing an impurity of one conductivity type from damaging in etching and keeping an interface clean so as to prevent the semiconductor layer 203 from being contaminated with an impurity such as an organic material, metal and water vapor. Therefore, the insulating layer 204 is preferably made from a dense film. A silicon nitride film made by glow discharge decomposition by using a silicide gas diluted 100-fold to 500-fold with a rare gas element such as argon is preferable since it becomes a dense film under a deposition temperature of 100° C. or less. An insulating layer may also be formed by using a lamination structure, if necessary.

A composition is selectively discharged over the insulating layer 204 to form a mask 205 at a position corresponding to the gate electrode layer 201 (see FIG. 5B). A resin material such as epoxy resin, acrylic resin, phenol resin, novolac resin, melamine resin and urethane resin is used as the mask 205. Alternatively, the mask may also be made from an organic material such as benzocyclobutene, parylene, flare and polyimide having a light transmitting property; a material including a compound formed by polymerization such as a siloxane polymer; a material containing a water-soluble homopolymer and a water-soluble copolymer; and the like by using the droplet discharging method. In addition, a commercially available resist material including a photosensitive agent may be also used. For example, it is possible to use a typical positive resist including a novolac resin and a naphthoquinonediazide compound that is a photosensitive agent; a negative resist including base resin, diphenylsilanediol, and an acid generating material, and the like. The surface tension and the viscosity of any material are appropriately adjusted by controlling the solvent concentration or by adding a surfactant, etc.

By utilizing the mask 205, the insulating layer 204 is etched to form an insulating layer 206 functioning as the channel protection layer (see FIG. 5C). The mask 205 is removed. A semiconductor layer 207 containing an impurity of one conductivity type is formed over the semiconductor layer 203 and the insulating layer 206. The semiconductor layer 207 containing the impurity of one conductivity type may be made by using silane gas and phosphine gas and can be formed of an AS or an SAS.

The subsequent steps are identical to those of Embodiment Mode 3. Concretely, resist 307 is applied (see FIG. 7B). As a material for the resist, a commercially available negative resist material containing a photosensitive agent may be employed. For example, it is possible to use a typical negative resist including base resin, diphenylsilanediol, and an acid generating material, and the like. The surface tension and the viscosity of any material are appropriately adjusted by controlling the solvent concentration or by adding a surfactant, etc.

Next, the resist 307 is exposed from a rear surface of the substrate (see FIG. 7B). Since the gate electrode layer 301 exists over the substrate, the resist over the gate electrode layer 301 is not exposed. Therefore, the resist provided over a channel portion 308 can be only selectively removed by development (see FIG. 7C).

By utilizing remaining resist 309 and 310 as masks, the semiconductor layer 304 containing the impurity of one conductivity type is etched to form semiconductor layers 311 and 312 containing the impurity of one conductivity type (see FIG. 7D). Accordingly, the masks for etching the semiconductor layer containing the impurity of one conductivity type can be formed in a self-aligning manner and utilized.

Alternatively, a commercially available negative resist material containing a photosensitive agent may be employed as the mask 305. By utilizing the mask 305, the semiconductor layer 304 containing the impurity of one conductivity type and the semiconductor layer 303 are etched. Subsequently, the mask 305 is exposed from the rear surface of the substrate. Since the gate electrode layer 301 exists over the substrate, the mask containing the photosensitive agent over the gate electrode layer 301 is not exposed. Therefore, the mask provided over the channel portion 308 can be only selectively removed by development. By utilizing the remaining mask containing the photosensitive agent, the semiconductor layer 304 containing the impurity of one conductivity type may be etched to form semiconductor layers 311 and 312 containing the impurity of one conductivity type. In this case, the step of forming the resist 307 can be omitted.

The subsequent steps are identical to those of Embodiment Mode 1. Source and drain wirings 113 and 114 is formed, and a passivation layer 115 formed over the source and drain wirings.

According to the above steps, a channel stop TFT can be manufactured (FIG. 5D).

Embodiment Mode 5

A method for manufacturing a channel-etched TFT using exposure of a top surface will be described in Embodiment Mode 5.

Figure 9A:
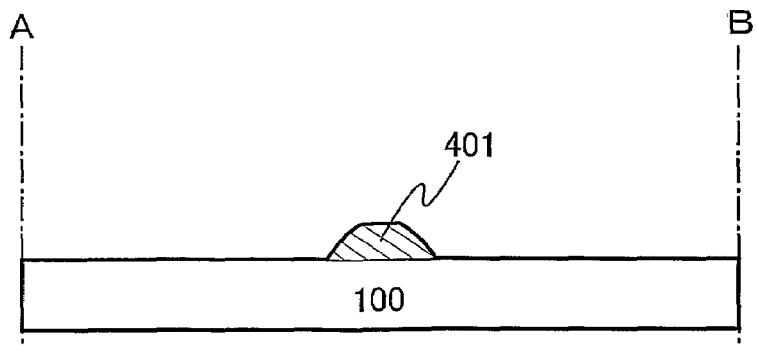
FIGS. 9A to 9D are cross sectional views explaining steps of manufacturing a thin film transistor according to the invention.

FIG. 9A shows a step of forming a gate electrode layer on a substrate 100. FIG. 9A illustrates a schematic longitudinal sectional structure while FIG. 3 illustrates a top plan structure corresponding to a line A-B.

A composition containing a conductive material is discharged over the substrate 100 by the droplet discharging method to form a gate electrode layer 401. A base layer may be formed from a metal material such as Ti (titanium), W (tungsten), Cr (chromium), Ta (tantalum), Ni (nickel) and molybdenum (Mo) or oxide thereof, over the substrate 100 by sputtering or vapor deposition such that the gate electrode layer is well-adhered to the substrate. When forming a conductive base layer, it is necessary that the base layer that is not overlapped with the gate electrode layer is oxidized to be insulated or removed by etching while utilizing the gate electrode layer as a mask.

Figure 9B:
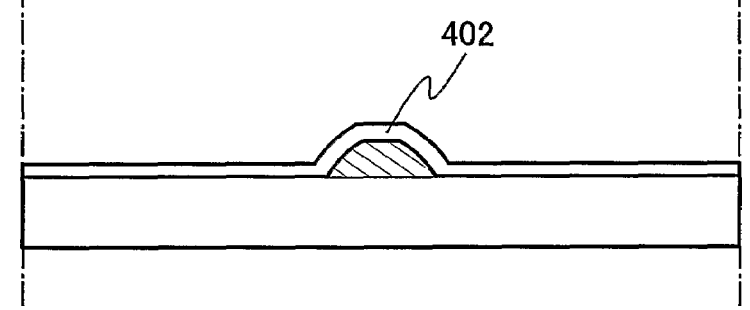

A gate insulating layer 402 is next formed by plasma CVD or sputtering to have a single layer or a lamination structure (see FIG. 9B). In particular, the gate insulating layer 402 is preferably formed by laminating three layers of an insulating layer made from silicon nitride, an insulating layer made from silicon oxide and another insulating layer made from silicon nitride.

A semiconductor layer 403 is next formed.

A semiconductor layer 404 containing an impurity of one conductivity type is formed over the semiconductor layer 403. The semiconductor layer 404 containing the impurity of one conductivity type may be formed by using silane gas and phosphine gas and can be formed of an AS or an SAS.

Figure 9C:
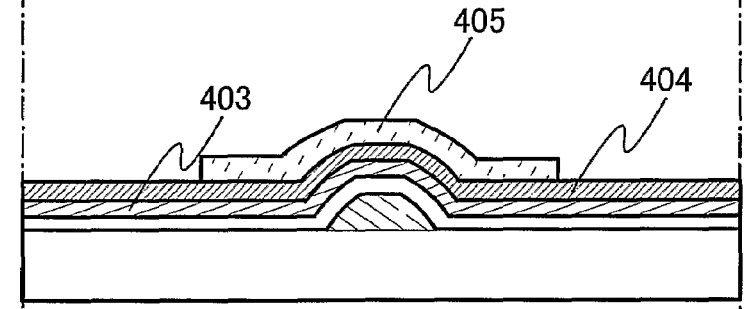
Figure 9D:
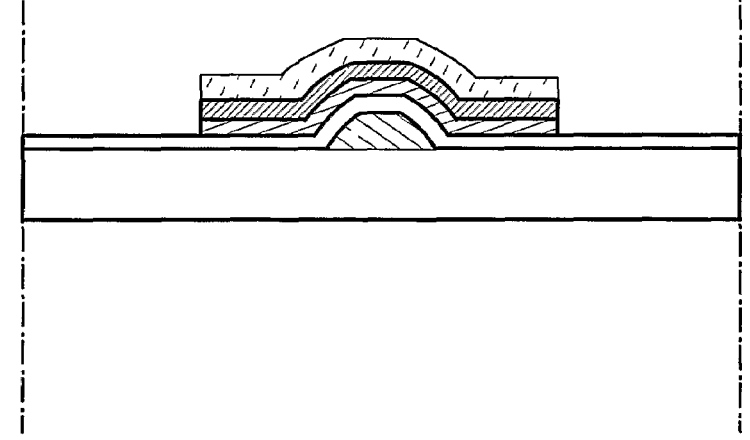

A mask 405 is formed on the semiconductor layer 404 containing the impurity of one conductivity type by the droplet discharging method. By utilizing the mask 405, the semiconductor layer 404 containing the impurity of one conductivity type and the semiconductor layer 403 are etched (see FIGS. 9C and 9D).

Subsequently, the mask 405 is removed to form a semiconductor region 406 (see FIG. 10A).

Next, resist 407 is applied (see FIG. 10B). As a material for the resist, a commercially available positive resist material containing a photosensitive agent may be employed. For example, it is possible to use a typical positive resist including a novolac resin and a naphthoquinonediazide compound that is a photosensitive agent and the like. The surface tension and the viscosity of any material are appropriately adjusted by controlling the solvent concentration or by adding a surfactant, etc.

Next, the resist 407 is exposed from a top surface of the substrate (see FIG. 10B). Since the gate electrode layer 401 exists over the substrate, the thickness of the resist over the gate electrode layer 401 is thin (see FIG. 10B). Therefore, the thin resist provided over a channel portion 408 can be only selectively removed in development by adjusting the amount of exposure (see FIG. 10C).

By utilizing remaining resist 409 and 410 as masks, the semiconductor layer 404 containing the impurity of one conductivity type is etched to form semiconductor layer 411 and 412 containing the impurity of one conductivity type (see FIG. 10D). Accordingly, the masks for etching the semiconductor layer containing the impurity of one conductivity type can be formed in a self-aligning manner and utilized.

Alternatively, a commercially available positive resist material containing a photosensitive agent may be employed as the mask 405. By utilizing the mask 405, the semiconductor layer 404 containing the impurity of one conductivity type and the semiconductor layer 403 are etched. Subsequently, the mask 405 is exposed from the top surface of the substrate. Since the gate electrode layer 401 exists over the substrate, the thickness of the mask over the gate electrode layer 401 is thin. Therefore, the thin mask provided over the channel portion 408 can be only selectively removed in development by adjusting the amount of exposure. By utilizing the remaining mask containing the photosensitive agent, the semiconductor layer 404 containing the impurity of one conductivity type may be etched to form the semiconductor layers 411 and 412 containing the impurity of one conductivity type. In this case, the step of forming the resist 407 can be omitted.

The subsequent steps are identical to those of Embodiment Mode 1 (see FIGS. 11A, 11B and 11C).

According to the above-described steps, a channel-etched TFT can be manufactured (see FIG. 11D).

Embodiment Mode 6

A method for manufacturing a channel stop TFT using exposure of a top surface will be described in Embodiment Mode 6.

A composition containing a conductive material is discharged over a substrate 100 by the droplet discharging method to form a gate electrode layer 201. A gate insulating layer 202 is next formed by plasma CVD or sputtering to have a singe layer or a lamination structure. Preferably, the gate insulating layer is formed by laminating three layers of an insulating layer made from silicon nitride, an insulating layer made from silicon oxide and another insulating layer made from silicon nitride. A semiconductor layer 203 is next formed. The above steps are identical to those of Embodiment Mode 5.

An insulating layer 204 is formed on the semiconductor layer 203 by plasma CVD or sputtering. As shown in the subsequent step, the insulating layer 204 remains on the semiconductor layer 203 at a position corresponding to the gate electrode layer so as to serve as a channel protection layer.

The channel protection layer has advantageous effects of protecting the semiconductor layer containing the impurity of the one conductivity type from damaging in etching and keeping an interface clean so as to prevent the semiconductor layer 203 from being contaminated with an impurity such as an organic material, metal and water vapor. Therefore, the insulating layer 204 is preferably made from a dense film. A silicon nitride film made by glow discharge decomposition by using a silicide gas diluted 100-fold to 500-fold with a rare gas element such as argon is preferable since it becomes a dense film under a deposition temperature of 100° C. or less. An insulating layer may be formed by using a lamination structure, if necessary.

A composition is selectively discharged over the insulating layer 204 to form a mask 205 at a position corresponding to the gate electrode layer 201 (see FIG. 5B). A resin material such as epoxy resin, acrylic resin, phenol resin, novolac resin, melamine resin and urethane resin is used as the mask 205. Alternatively, the mask may also be made from an organic material such as benzocyclobutene, parylene, flare and polyimide having a light transmitting property; a material including a compound formed by polymerization such as a siloxane polymer; a material containing a water-soluble homopolymer and a water-soluble copolymer; and the like by using the droplet discharging method. In addition, a commercially available resist material including a photosensitive agent may be also used. For example, it is possible to use a typical positive resist including a novolac resin and a naphthoquinonediazide compound that is a photosensitive agent; a negative resist including base resin, diphenylsilanediol, and an acid generating material, and the like. The surface tension and the viscosity of any material are appropriately adjusted by controlling the solvent concentration or by adding a surfactant, etc.

By utilizing the mask 205, the insulating layer 204 is etched to form an insulating layer 206 functioning as the channel protection layer (see FIG. 5C). The mask 205 is removed. A semiconductor layer 207 containing an impurity of one conductivity type is formed over the semiconductor layer 203 and the insulating layer 206. The semiconductor layer 207 containing the impurity of one conductivity type may be made by using silane gas and phosphine gas and can be formed of an AS or an SAS.

The subsequent steps are identical to those of Embodiment Mode 5. Next, resist 407 is applied (see FIG. 10B). As a material for the resist, a commercially available positive resist material containing a photosensitive agent may be employed. For example, it is possible to use a typical positive resist including a novolac resin and a naphthoquinonediazide compound that is a photosensitive agent and the like. The surface tension and the viscosity of any material are appropriately adjusted by controlling the solvent concentration or by adding a surfactant, etc.

Next, the resist 407 is exposed from a top surface of the substrate (see FIG. 10B). Since the gate electrode layer 401 exists over the substrate, the thickness of the resist over the gate electrode layer 401 is thin (see FIG. 10B). Therefore, the thin resist provided over a channel portion 408 can be only selectively removed in development by adjusting the amount of exposure (see FIG. 10C).

By utilizing remaining resist 409 and 410 as masks, the semiconductor layer 404 containing the impurity of one conductivity type is etched to form semiconductor layer 411 and 412 containing the impurity of one conductivity type (see FIG. 10D). Accordingly, the masks for etching the semiconductor layer containing the impurity of one conductivity type can be formed in a self-aligning manner and utilized.

The subsequent steps are identical to those of Embodiment Mode 1. Source and drain wirings 113 and 114 is formed, and a passivation layer 115 formed over the source and drain wirings.

According to the above steps, a channel stop TFT can be manufactured (FIG. 5D).

Embodiment Mode 7

A method for manufacturing a staggered TFT will be described in Embodiment Mode 7.

Figure 12A:
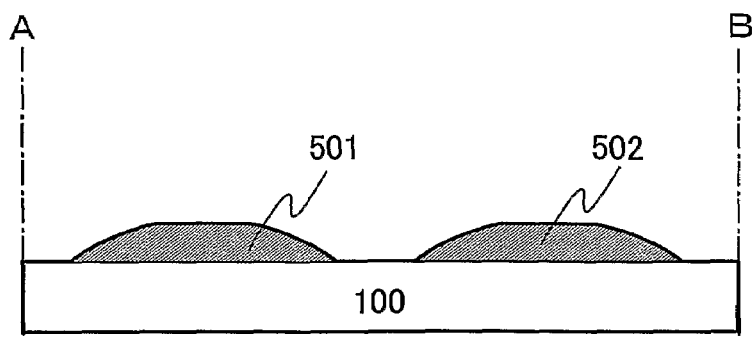
FIGS. 12A to 12D are cross sectional views explaining steps of manufacturing a thin film transistor according to the invention.

A composition containing a conductive material is selectively discharged over a substrate 100 by the droplet discharging method to form source and drain wirings 501 and 502 (see FIG. 12A). As the conductive material for forming the wirings, a composition containing a metal particle such as Ag (silver), Au (gold), Cu (copper), W (tungsten) and Al (aluminum) as its principal constituent can be used. Also, light-transmitting indium tin oxide (ITO), ITSO including indium tin oxide and silicon oxide, organic indium, organic tin, zinc oxide, titanium nitride and the like may be used in combination with the above-mentioned conductive materials. A base film may be formed over the substrate 100 such that the source and drain wirings are well-adhered to the substrate. The base layer may be formed of a metal material such as Ti (titanium), W (tungsten), Cr (chromium), Ta (tantalum), Ni (nickel) and Mo (molybdenum), or oxide thereof by sputtering, vapor deposition, or the like. When forming a conductive base layer, the base layer that is not overlapped with the source and drain wirings must be oxidized to be insulated or must be removed by etching while utilizing the source and drain wirings as masks.

A semiconductor layer containing an impurity of one conductivity type is next formed. The semiconductor layer containing the impurity of one conductivity type may be formed by using silane gas and phosphine gas and can be formed of an AS or an SAS. A mask is formed over the semiconductor layer containing the impurity of one conductivity type. By utilizing the mask, etching is performed to form semiconductor layers 503 and 504 containing the impurity of one conductivity type. The mask is then removed. Alternatively, semiconductor layers containing an impurity of one conductivity type may selectively be formed only on the surfaces of the source and drain wirings 501 and 502 by plasma doping. In the plasma doping, only the surfaces of the source and drain wirings are selectively doped by PF glow discharge while flowing phosphine gas by using a plasma CVD and the like.

Figure 12B:
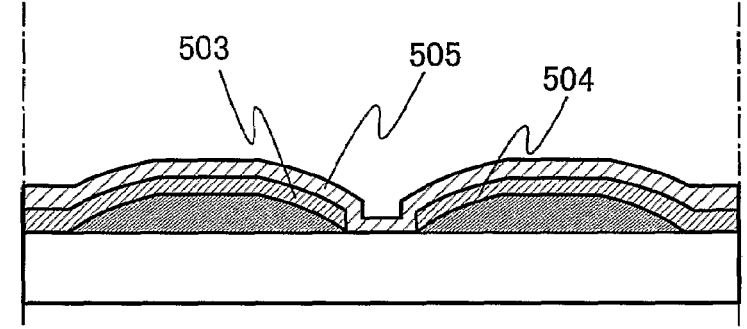

A semiconductor layer 505 is next formed (see FIG. 12B).

Figure 12C:
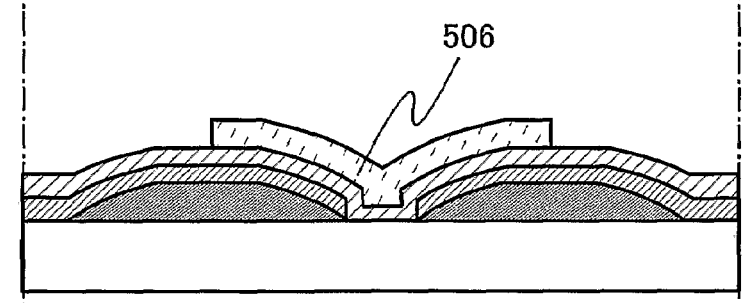
Figure 12D:
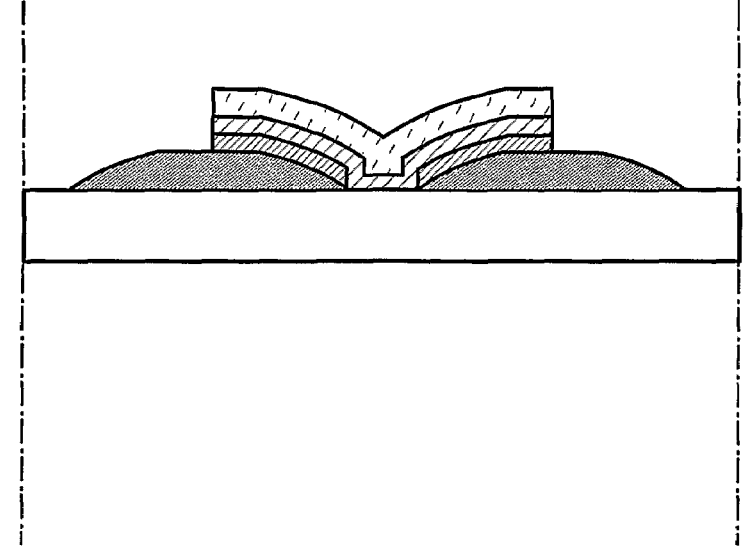

A mask 506 is formed over the semiconductor layer 505 by the droplet discharging method. By utilizing the mask 506, the semiconductor layers 503 and 504 having the impurity of one conductivity type and the semiconductor layer 505 are etched (see FIGS. 12C and 12D).

Subsequently, a semiconductor region is formed by removing the mask 506.

Figure 13A:
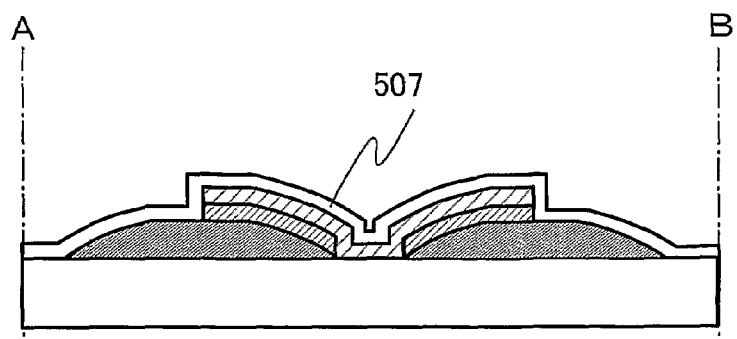
FIGS. 13A to 13D are cross sectional views explaining steps of manufacturing a thin film transistor according to the invention.

A gate insulating layer 507 is formed by plasma CVD or sputtering to have a single layer or a lamination structure (see FIG. 13A). Preferably, the gate insulating layer is formed by laminating three layers of an insulating layer made from silicon nitride, an insulating layer made from silicon oxide and another insulating layer made from silicon nitride.

Figure 13B:
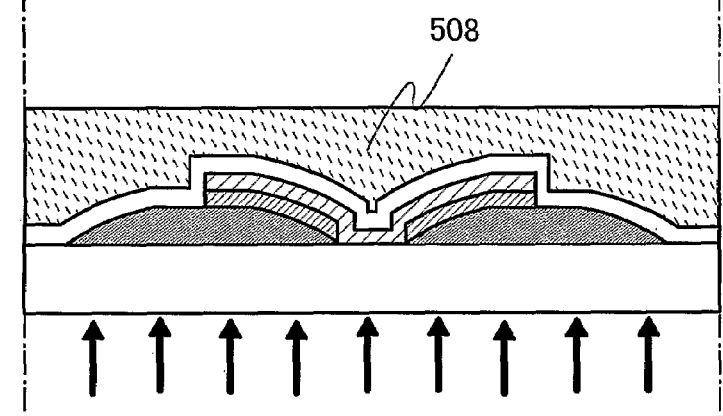

Next, resist 508 is applied (see FIG. 13B). As a material for the resist, a commercially available negative resist material containing a photosensitive agent may be employed. For example, it is possible to use a typical negative resist including base resin, diphenylsilanediol, and an acid generating material, and the like. The surface tension and the viscosity of any material are appropriately adjusted by controlling the solvent concentration or by adding a surfactant, etc.

Figure 13C:
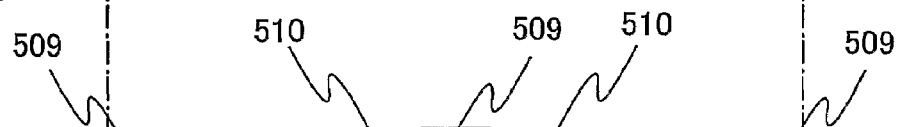

The resist 508 is exposed from a rear surface of the substrate (see FIG. 13B). Since the source and drain wirings 501 and 502 exist over the substrate, the resist over the source and drain wirings 501 and 502 is not exposed. Therefore, the resist provided in regions 510 as shown in the drawing can be only selectively removed by development (see FIG. 13C).

Figure 13D:
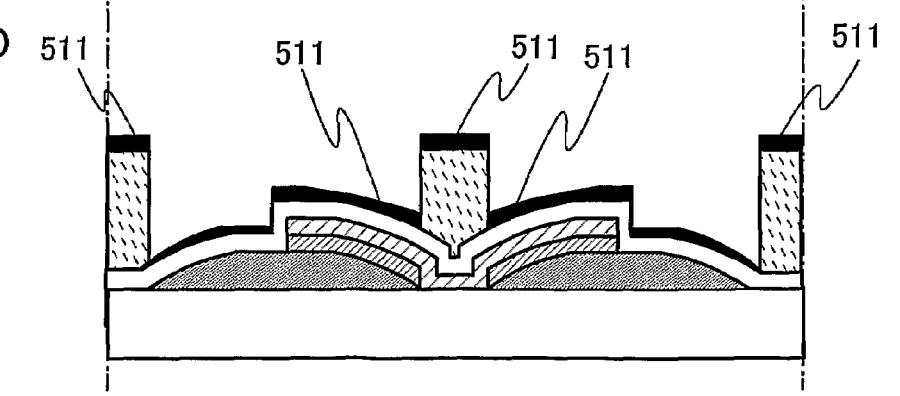

Subsequently, a solution for forming a region with low wettability is discharged or applied (see FIG. 13D). As an example of a composition for a solution used for forming the region with low wettability, a silane coupling agent denoted by a chemical formula: $R_n$—Si—$X_{(4-n)}$ (n=1, 2, 3) is used. In the chemical formula, R represents a substance containing a relatively inactive group such as an alkyl group. Further, X represents a substituent which can be hydrolysated by condensation and bonding to a hydroxyl group existing on a substrate surface or absorbed water such as a halogen group, a methoxy group, an ethoxy group and an acetoxy group.

Subsequently, the surface attached with the solution for forming the region with low wettability is washed so that an extremely thin surface 511 with low wettability can be formed.

Figure 14A:
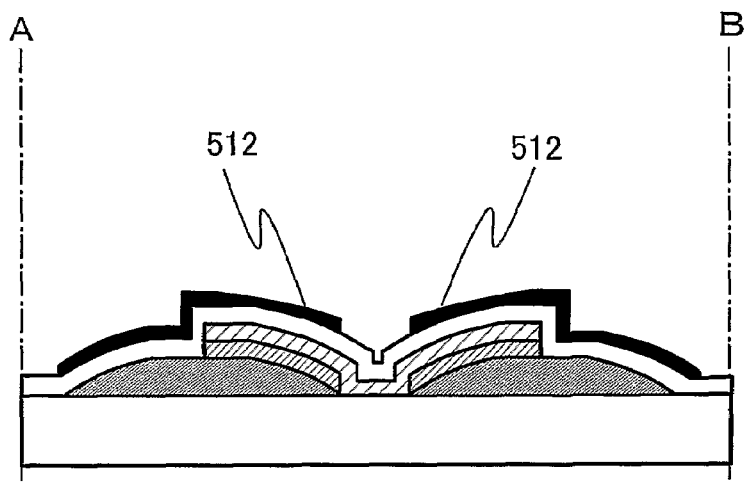
FIGS. 14A to 14C are cross sectional views explaining steps of manufacturing a thin film transistor according to the invention.

The remaining resist 509 is next removed by wet etching or the like. In this case, the region with low wettability over the resist is also removed by being lifted off so that regions 512 with low wettability become to exist only over the source and drain wirings (see FIG. 14A).

Figure 14B:
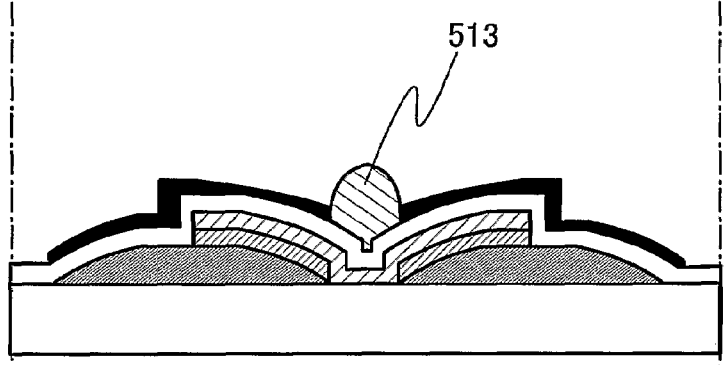

A composition containing a conductive material is discharged between the regions 512 with low wettability by the droplet discharging method so as to form a gate electrode layer 513 (see FIG. 14B). In this case, the gate electrode layer 513 can be formed in a self-aligning manner since it is sandwiched between the regions 512 with low wettability. As the conductive material for forming the gate electrode layer, metal such as Ag, Au, Cu, Ni, Pt, Pd, Ir, Rh, W, Al, Ta, Mo, Cd, Zn, Fe, Ti, Si, Ge, Zr and Ba; fine particles such as silver halide; or dispersive nanometer-size particles can be used. In addition, ITO (indium tin oxide), ITO containing silicon oxide as a component, organic indium, organic tin, zinc oxide (ZnO), titanium nitride (TiN) and the like, each of which is generally used as a transparent conductive layer, can be used. In order to reduce resistivity, a solvent in which any one of gold, silver and copper is dissolved or dispersed is preferably used in consideration of the specific resistance value. More preferably, low resistive silver or copper may be used. In the case of using silver or copper, a barrier film is preferably used in combination with silver or copper so as to prevent impurities. As a barrier film in combination with a wiring made from copper, an insulating or a conductive substance containing nitrogen such as silicon nitride, silicon oxynitride, aluminum nitride, titanium nitride and tantalum nitride (TiN) is preferably employed. These materials may be formed by the droplet discharging method. The solvent corresponds to an organic solvent or the like. As the organic solvent, ester such as butyl acetate, alcohol such as isopropyl alcohol and ketone such as acetone are given. The surface tension and the viscosity are arbitrarily adjusted by controlling the concentration of the solution or by adding a surfactant and the like. The conductive layer is formed by stacking conductive fine particles three-dimensionally and irregularly. That is, the conductive layer includes three-dimensional aggregate particles. Therefore, the surface thereof is slightly uneven. The diameter of fine particles is increased by heating the particles, and therefore, the conductive layer has a rough surface. Further, a binder formed of an organic substance remains in the conductive layer depending on a heating temperature, an atmosphere and times.

Next, the extremely thin film constituting the region 512 with low wettability is removed by etching or the like.

A passivation layer 514 is preferably formed on the gate electrode layer 513. The passivation layer can be formed from silicon nitride, silicon oxide, silicon nitride oxide, silicon oxynitride, aluminum oxynitride, aluminum oxide, diamond like carbon (DLC), carbon nitride (CN) and another insulating material by using a method for forming a thin film such as plasma CVD and sputtering.

Figure 14C:
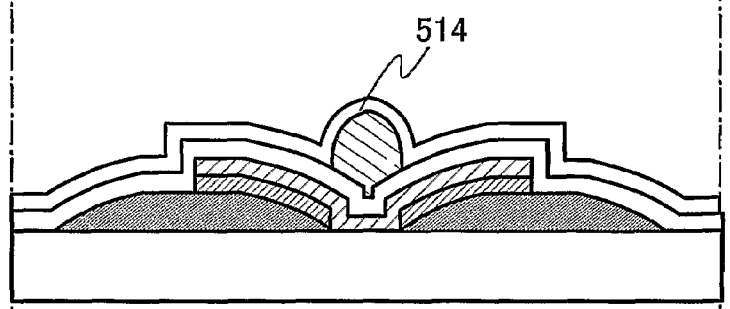

According to the above-mentioned steps, a staggered TFT can be manufactured (see FIG. 14C).

Embodiment Mode 8

A method for manufacturing a liquid crystal display panel having a TFT that can be manufactured according to Embodiment Modes 1 through 7 will be described in Embodiment Mode 8.

A passivation layer or a passivation layer and a gate insulating layer is/are etched to form an opening so that contact portion is provided. A composition containing a conductive material is selectively discharged in the openings to form a pixel electrode layer such that the pixel electrode layer is electrically connected to the source and drain wirings therethrough. Alternatively, when a pixel electrode layer is formed prior to forming the passivation layer or the passivation layer along with the gate insulating layer, the contact portion is not necessary to be formed.

Alternatively, the pixel electrode layer may be formed by sputtering and then be patterned.

An insulating layer that is also referred to as an orientation film is next formed by printing or spin coating so as to cover the pixel electrode layer. When the insulating layer is formed by screen printing or offset printing, it can be formed selectively. Thereafter, rubbing is performed. Note that the orientation film can also be formed by oblique evaporation. Subsequently, a sealing material is discharged in the periphery of a pixel by the droplet discharging method.

Afterwards, a counter substrate over which an insulating layer functioning as an orientation film and a conductive layer functioning as a counter electrode layer are provided is attached to the TFT substrate through a spacer. A liquid crystal layer is provided in a space between the counter substrate and the TFT substrate so that a liquid crystal display panel can be manufactured. The sealing material may be mixed with a filler. Also, the counter substrate may be provided with a color filter, a light shielding film (black matrix) and the like. As a method for forming the liquid crystal layer, it is possible to employ the dispensing method (dropping method) or the dipping method (pumping up method) by which liquid crystal is injected by capillary phenomenon after the counter substrate is attached to the TFT substrate.

In the method for injecting liquid crystal employing the dispensing method, a closed loop is formed by using a sealing material and a drop or a few drops of liquid crystal is dropped therein. Subsequently, the substrates are attached to each other in vacuum, and then irradiated with ultraviolet ray so as to cure the sealing material. Accordingly, the liquid crystal is filled between the substrates.

The insulating layer in a region over which a wiring substrate will be formed is selectively removed by an ashing treatment using oxygen gas under atmospheric pressure or almost atmospheric pressure. The ashing treatment is carried out by using the oxygen gas along with one or more of hydrogen, $CF_4$, $NF_3$, $H_2O$ and $CHF_3$. Although the ashing treatment is performed after sealing with the counter substrate in order to prevent the deterioration or destruction due to electrostatic charge in the this step, the ashing treatment may be performed at any time if electrostatic charge hardly adversely affect.

Subsequently, a wiring substrate is provided such that it is electrically connected to the gate wiring layer through an anisotropic conductive layer. The wiring substrate is given to transmit signals or potential from the outside.

According to the above-mentioned steps, a liquid crystal panel can be fabricated. In addition, a protective circuit for preventing electrostatic damage, typically, a diode or the like, may be provided between a connection terminal and the source wiring (or gate wiring) or in a pixel portion. In this case, a diode can be formed in the same steps as the above-described TFT and the gate wiring layer of the pixel portion and a drain or source wiring of the diode are connected to each other.

Embodiment Mode 9

A method for manufacturing a light emitting display panel having a TFT that is manufactured according to any one of Embodiment Modes 1 through 7 will be described in Embodiment Mode 9.

A passivation layer or a passivation layer and a gate insulating layer is/are etched to form an opening so that contact portion is provided. A composition containing a conductive material is selectively discharged in the contact portion to form a first electrode corresponding to a pixel electrode layer such that the source and drain wirings are electrically connected thereto. Alternatively, when the first electrode corresponding to the pixel electrode layer is formed prior to forming the passivation layer or the passivation layer along with the gate insulating layer, the contact portions are not necessary to be formed.

In the case of forming a transmissive EL display panel, a predetermined pattern may be formed from a composition containing indium tin oxide (ITO), indium tin oxide containing silicon oxide (ITSO), zinc oxide (ZnO), tin oxide ($SnO_2$) or the like and may be baked to then form a pixel electrode.

Preferably, the pixel electrode is formed from indium tin oxide (ITO), indium tin oxide containing silicon oxide (ITSO), zinc oxide (ZnO) or the like by sputtering. More preferably, ITO containing silicon oxide is formed by sputtering with use of a target that is ITO containing 2 to 10 weight % silicon oxide. In addition, a conductive oxide material containing silicon oxide in which 2 to 20% zinc oxide (ZnO) is mixed in indium oxide may be used. Also, ZnO doped with Ga may be used. After forming the first electrode by sputtering, a mask layer may be formed by droplet discharging method. By utilizing the mask layer, etching may be performed to form a first electrode connecting to the source and drain wirings. When the first electrode made of indium tin oxide containing silicon oxide is formed close to an insulating layer made from silicon nitride that is included in the gate insulating layer, the rate of light emission outwardly, which is generated in an EL layer, can be improved effectively.

When light generated in the EL layer is emitted in the opposite direction of the substrate, in the case of manufacturing a reflective EL display panel, a composition containing a metal particle such as Ag (silver), Au (gold), Cu (copper), W (tungsten) and Al (aluminum) as its principal constituent can be used. As another method for forming the first electrode layer, a transparent conductive film or a light reflective conductive film may be formed by sputtering, a mask pattern may be formed by the droplet discharging method, and etching may be performed so as to form the first electrode layer. In this case, by mixing a coloring pigment in an insulating layer that will be formed in the subsequent step, the insulating layer can serve as a light-shielding film, thereby improving the contrast of a display device achieved later. Accordingly, by utilizing an insulating layer, resist or the like mixed with a pigment, it can function as a light-shielding film.

Next, an insulating layer is formed. An insulating film is formed over an entire surface of the substrate by spin coating or dipping and the insulating film is processed by etching to form the insulating layer. When the insulating film is formed by the droplet discharging method, the etching process is not particularly required. Also, when a region with low wettability is provided in a subject portion to form an opening, the opening can be formed in a self-aligning manner. The insulating layer is formed with an opening (through hole) that is provided in accordance with a pixel position corresponding to the first electrode. The insulating film can be made from inorganic insulating material such as silicon oxide, silicon nitride, silicon oxynitride, aluminum oxide, aluminum nitride and aluminum oxynitride; acrylic acid, mathacrylic acid or a derivative thereof; a heat-resistant polymer such as polyimide, aromatic polyimide and polybenzimidazole; an inorganic siloxane-based insulating material containing Si—O—Si bonds among compounds including silicon, oxygen and hydrogen that are formed using a siloxane material as a starting material; or an organic siloxane-based insulating material in which hydrogen in silicon is substituted for an organic group such as methyl and phenyl. When using a photosensitive or a non-photosensitive material such as acrylic and polyimide, a side face of the insulating layer has a radius of curvature that varies continuously. This is preferable since a thin film of an upper layer can be formed without being disconnected. Also, a low dielectric constant (low-k) material may be employed.

An EL layer is formed by the application method such as vapor deposition, spin coating and ink-jet.

Prior to forming the EL layer, the substrate is subjected to a heat treatment at 200° C. under an atmospheric pressure to remove moisture contained in the insulating layer or adhered to the surface thereof. Also, a heat treatment is carried out at 200 to 400° C., preferably, 250 to 350° C. under reduced pressure and the EL layer is preferably formed successively by vacuum deposition or by the droplet discharging method under reduced pressure without exposing it to atmospheric air. Additionally, the surface of the first electrode may be treated by being exposed to oxygen plasma or by being irradiated with ultraviolet ray.

A second electrode is formed over the EL layer to form a light emitting element. The light emitting element is connected to a driving TFT. Thereafter, a protective lamination layer is formed to seal the light emitting element. The protective lamination layer is formed by sequentially laminating a first inorganic insulating layer, a stress relaxation layer and a second inorganic insulating layer.

The EL layer is formed of a charge injecting/transporting substance containing an organic compound or an inorganic compound and a light emitting material. The EL layer includes one or plural kinds of layers selected from a low molecular weight organic compound, an intermediate molecular weight organic compound (which indicates an organic compound that does not sublimate and has 20 or less molecules or a chained molecule with a length of 10 μm or less) and a high molecular weight organic compound depending on the number of its molecules. Further, the EL layer may be formed in combination with an inorganic compound with an electron injecting/transporting property or a hole injecting/transporting property.

With respect to substances with excellent electron transporting properties among the charge injecting/transporting substances, for example, metal complexes having quinoline skeleton or benzoquinoline skeleton such as tris(8-quinolinolate)aluminum (abbreviation: $Alq_3$); tris(5-methyl-8-quinolinolate)aluminum (abbreviation: $Almq_3$); bis(10-hydroxybenzo[h]quinolinolate)beryllium (abbreviation: $BeBq_2$); and bis(2-methyl-8-quinolinolate)-4-phenylphenolate-aluminum (abbreviation: BAlq) can be given.

As substances having superior hole transporting properties, for example, the following substances can be cited: aromatic amine (i.e., one having a benzene ring-nitrogen bond) based compounds such as: 4,4'-bis[N-(1-naphthyl)-N-phenyl-amino]-biphenyl (abbreviation: $\alpha$-NPD); 4,4'-bis[N-(3-methylphenyl)-N-phenyl-amino]-biphenyl (abbreviation: TPD); 4,4',4"-tris(N,N-diphenyl-amino)-triphenylamine (abbreviation: TDATA); and 4,4',4"-tris[N-(3-methylphenyl)-N-phenyl-amino]-triphenylamine (abbreviation: MTDATA).

With respect to substances having extremely superior electron injecting properties among the charge injecting/transporting substances, compounds of an alkali metal or an alkali earth metal such as lithium fluoride (LiF), cesium fluoride (CsF) and calcium fluoride ($CaF_2$) can be cited. In addition, a mixture of a substance having a high electron transportation property such as $Alq_3$ and an alkali earth metal such as magnesium (Mg) may be used.

With respect to substances having extremely superior hole injecting properties among the charge injecting/transporting substances, for example, the following substances can be cited: metal oxide such as molybdenum oxide ($MoO_x$), vanadium oxide ($VO_x$), ruthenium oxide ($RuO_x$), tungsten oxide ($WO_x$) and manganese oxide ($MnO_x$). Besides, phthalocyanine based compounds such as phthalocyanine (abbreviation: $H_2Pc$) and copper phthalocyanine (CuPc) can be mentioned.

EL layers having different light-emitting wavelength bands may be formed in each pixel so as to perform color display. Typically, EL layers corresponding to respective colors of R (red), G (green) and B (blue) are formed. In this case, when a filter (colored layer) that transmits light of the wavelength bands is provided at a light emission side of pixels, color purity can be improved and specular reflexion (glare) of a pixel portion can be prevented. By providing the filter (colored layer), a circular polarizing plate or the like, which has conventionally been required, can be eliminated. Therefore, loss of light emitted from the EL layer can be eliminated. Also, change in color tone, that is caused in the case where a pixel portion (display screen) is seen obliquely, can be reduced.

There are various kinds of light emitting materials. With respect to low molecular weight organic light emitting materials, the following substances can be used: 4-dicyanomethylene-2-methyl-6-[-2-(1,1,7,7-tetramethyl -9-julolidyl)ethenyl)-4H-pyran (abbreviation: DCJT); 4-dicyanomethylene-2-t-butyl-6-[2-(1,1,7,7-tetramethyl-julolidine-9-yl)ethenyl]-4H-py ran (abbreviation: DPA); periflanthene; 2,5-dicyano-1,4-bis[2-(10-methoxy-1,1,7,7-tetramethyl-julolidine-9-yl) ethenyl]benzen e, N,N'-dimethylquinacridone (abbreviation: DMQd); coumarin 6; coumarin 545T; tris(8-quinolinolato) aluminum (abbreviation: $Alq_3$); 9,9'-biantryl, 9,10-diphenylanthracene (abbreviation: DPA); 9,10-bis(2-naphthyl)anthracene (abbreviation: DNA); and the like. Also, another substance may be used.

On the other hand, as compared with the low molecular weight organic light emitting materials, the high molecular weight organic light emitting materials have higher physical strength, which results in more durable elements. In addition, since the high molecular weight organic light emitting materials can be formed by a coating method using a liquid, an element can be formed relatively easily. A structure of a light emitting element made from the high molecular weight organic light emitting material is basically similar to that of the low molecular weight organic light emitting material, and is formed by sequentially laminating a cathode, a layer containing a light emitting substance and an anode. However, when a layer containing a light emitting substance is made from the high molecular weight organic light emitting material, it is difficult to form the lamination structure like the case of using the low molecular weight organic light emitting material. In many cases, such the light emitting element made from the high molecular weight organic light emitting material has a two layer structure. Concretely, it is a structure formed by sequentially laminating a cathode, an EL layer, a hole transporting layer and an anode.

The luminescent color is determined by a material for forming an EL layer, and hence, a light emitting element that emits a predetermined color of light can be formed by selecting the material. As high molecular weight light emitting materials that can be used to form an EL layer, poly(paraphenylene vinylene), polyparaphenylene, polythiophene, polyfluorene and the like can be mentioned.

Specifically, the following substances can be cited as polyparaphenylene vinylene: a derivative of poly(paraphenylene vinylene) (PPV); poly(2,5-dialkoxy-1,4-phenyene vinylene) (RO-PPV); poly[2-(2'-ethyl-hexoxy)-5-methoxy-1,4-phenylene vinylene] (MEH-PPV); poly[2-dialkoxyphenyl]-1,4-phenylene vinylene] (ROPh-PPV); and the like. With respect to the polyparaphenylene, the following substances can be cited: a derivative of polyparaphenylene (PPP); poly(2,5-dialkoxy-1,4-phenylene) (RO-PPP); poly(2,5-dihexoxy-1,4-phenylene); and the like. With respect to the polythiophene, the following substances can be mentioned: a derivative of polythiophene (PT); poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly[3-(4-octylphenyl)-thiophene] (POPT); poly[3-(4-octylphenyl)-2,2-bithiophene] (PTOPT); and the like. With respect to the polyfluorene, the following substances can be cited: a derivative of polyfluorene (PF); poly(9,9-dialkylfluorene) (PDAF); poly (9,9-dioctylfluorene) (PDOF); and the like.

When a high molecular weight organic light emitting material with a hole transporting property is sandwiched between an anode and a high molecular weight organic light emitting material with a light emitting property, the hole injecting property from the anode can be improved. Generally, a solution in which a high molecular weight organic light emitting material with the hole transporting property is dissolved in water along with an acceptor material is applied by spin coating or the like. Since an organic solvent is insoluble, it can be laminated together with the above-mentioned light emitting materials with the light emitting properties. As the high molecular weight organic light emitting material with the hole transporting property, a mixture of PEDOT and camphor sulfonic acid (CSA) as an acceptor material; a mixture of polyaniline (PANI) and polystyrenesulfonic acid (PSS) as a acceptor material; and the like can be cited.

An EL layer can emit monochromatic light or white light. In the case of using a white light emitting material, a color display can be achieved by providing a color filter (colored layer) that transmits light of a certain wavelength toward a light emitting direction of a pixel.

In order to form an EL layer that emits white light, for example, white light emission can be achieved by sequentially laminating $Alq_3$, $Alq_3$ partially doped with Nile red, which is a red light emitting pigment, $Alq_3$, p-EtTAZ and TPD (aromatic diamine) by using vapor deposition. Also, when an EL layer is formed by application using spin coating, the EL is preferably baked by vacuum heating after application. For example, an aqueous solution of poly(ethylene dioxythiophene)/poly(styrenesulfonic acid) (PEDOT/PSS), which functions as a hole injecting layer, may be applied over the entire surface of the substrate and baked. Afterwards, a solution of polyvinyl carbazole (PVK) doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red and coumarin 6), which serves as a light emitting layer, may then be applied over the entire surface and baked.

An EL layer may be formed to have a single layer. In this case, 1,3,4-oxadiazole derivative (PBD) with an electron transporting property may be dispersed in polyvinyl carbazole (PVK) with a hole transporting property. In addition, white light emission can be obtained by dispersing 30 wt % PBD as an electron transporting agent and dispersing a suitable amount of four kinds of pigments (TPB, coumarin 6, DCM1, and Nile red). In addition to the above-mentioned light emitting elements that emit white light, a light emitting element capable of emitting red light, green light or blue light can be manufactured by properly selecting materials for the EL layer.

When a high molecular weight organic light emitting material with a hole transporting property is sandwiched between an anode and a high molecular weight organic light emitting material with a light emitting property, the hole injecting properties from the anode can be improved. Typically, a solution in which a high molecular weight organic light emitting material with the hole transporting property is dissolved in water along with an acceptor material is applied by spin coating or the like. Since an organic solvent is insoluble, it can be laminated together with the above-mentioned organic light emitting materials with the light emitting properties. As the high molecular weight organic light emitting material with the hole transporting property, a mixture of PEDOT and camphor sulfonic acid (CSA) as an acceptor material; a mixture of polyaniline (PANI) and polystyrenesulfonic acid (PSS) as a acceptor material; and the like can be cited.

Further, triplet excited light emitting materials including metal complexes and the like may be used as an EL layer in addition to singlet excited light emitting materials. For example, pixels emitting red light with luminance half-life, which is relatively shorter than those of pixels emitting green and glue light, are formed by a triplet excited light emitting material while pixels emitting green and blue light are formed of singlet excited light emitting materials. Since the triplet excited light emitting material has an excellent light emitting efficiency, it has a feature of requiring low power consumption in order to obtain a same level of luminance as compared with the singlet excited light emitting material. That is, when the pixels for emitting red light are formed by a triplet excited light emitting material, a small amount of current flowing through a light emitting element is required, thereby improving the reliability. To reduce power consumption, pixels emitting red and green light may be formed of the triplet excited light emitting materials, while pixels emitting blue light may be formed of a singlet excited light emitting material. In the case where a light emitting element that emit green light, which has high visibility with respect to human eyes, is also formed of a triplet excited light emitting material, power consumption can be further reduced.

As an example of the triplet excited light emitting material, there is one that uses a metal complex as a dopant. In particular, a metal complex with platinum, which is a third transition element, as its metal center, a metal complex with iridium as its metal center and the like are known. The triplet excited light emitting materials are not limited to these compounds, and it is possible to use a compound having an above mentioned structure and including an element that belongs to groups 8 to 10 of the periodic table as its metal center.

The above-mentioned substances for forming a layer containing a light emitting substance are examples, and a light emitting element can be formed by properly laminating respective layers with various properties such as a hole injecting/transporting layer, a hole transporting layer, an electron injecting/transporting layer, an electron transporting layer, an EL layer, an electron blocking layer and a hole blocking layer. In addition, a mixed layer or a mixed junction of these layers may be used. Further, the structure of an EL layer can be varied, and the EL layer can be formed in various forms. The structural change in the EL layer may be allowable without deviating the purpose of the invention; for example, an electrode is provided or a light emitting material is dispersed so as to functions as a light emitting layer, instead of providing a certain electron injecting layer or light emitting region.

Next, a sealing material is formed and the substrate is sealed with a sealing substrate. Afterwards, connection terminals are attached to respective edges of the gate wiring and the source wiring through an anisotropic conductive layer. Further, connection portions of the respective wirings and the connection terminals are preferably sealed with sealing resin. This structure can prevent moisture from penetrating into the light emitting element through a cross sectional portion so as to inhibit the light emitting element from being deteriorated.

According to the above-described steps, a light emitting display panel can be manufactured. Further, a protective circuit for preventing electrostatic damage, typically, a diode or the like, may be provided between the connection terminal and the source wiring (or gate wiring) or in a pixel portion. In this case, a diode can be formed in the same steps as the above TFT and the gate wiring of the pixel portion and a drain or source wiring of the diode are connected to each other.

Embodiment Mode 10

Configurations of light emitting elements that can be applied to the above embodiment modes will be described in Embodiment Mode 10 with reference to FIGS. 16A to 16D.

Figure 16A:
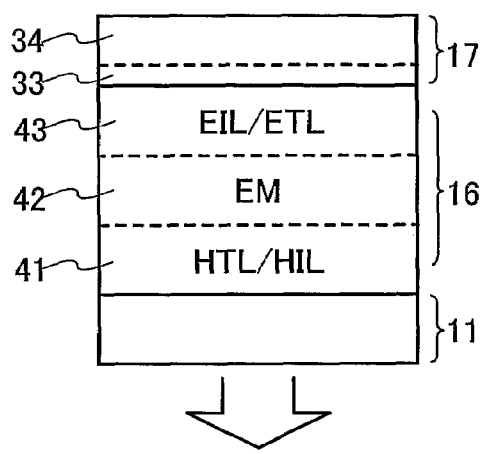
FIGS. 16A to 16D are diagrams showing modes of light emitting elements that are applicable to the present invention.

FIG. 16A shows an example in which a first pixel electrode 11 is made from a transparent conductive oxide material. Concretely, the first pixel electrode 11 is made from a conductive oxide material containing 1 to 15 atomic % silicon oxide. A layer 16 containing a light emitting substance, which is formed by sequentially laminating a hole injecting/transporting layer 41, a light emitting layer 42 and an electron transporting/injecting layer 43, is provided over the first pixel electrode 11. A second pixel electrode 17 includes a first electrode layer 33 containing an alkali metal such as LiF and MgAg or an alkali earth metal and a second electrode layer 34 made from a metal material such as aluminum. A pixel having this structure can emit light from the first pixel electrode 11 in the direction of an arrow as shown in the drawing.

Figure 16B:
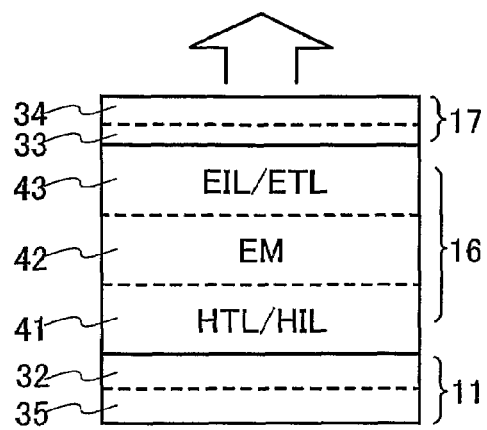

FIG. 16B shows an example of light emitted through a second electrode 17. A first pixel electrode 11 includes a first electrode layer 35 made from metal such as aluminum and titanium or a metal material containing the metal and nitrogen at a concentration in the stoichiometric quantity lower than the metal; and a second electrode layer 32 made from a conductive oxide material containing 1 to 15 atomic % silicon oxide. A layer 16 containing a light emitting substance, which is formed by sequentially laminating a hole injecting/transporting layer 41, a light emitting layer 42 and an electron transporting/injecting layer 43, is formed over the first pixel electrode 11. A second pixel electrode 17 includes a third electrode layer 33 containing an alkali metal such as LiF and CaF or an alkali earth metal and a fourth electrode layer 34 made from a metal material such as aluminum. Either third and fourth electrode layers are formed to have a thickness of 100 nm or less to transmit light so that light can be emitted through the second pixel electrode 17.

With respect to a light emitting element having the structure as shown in FIG. 16A or 16B, when light is emitted in both directions, i.e., through both the first and second pixel electrodes, the first pixel electrode 11 is made from a transparent conductive film with a high work function and the second pixel electrode 17 is made from a transparent conductive film with a low work function. Typically, the first pixel electrode 11 may be made from a conductive oxide material containing 1 to 15 atomic % silicon oxide and the second pixel electrode 17 may be formed by a third electrode layer 33 containing an alkali metal such as LiF and CaF or an alkali earth metal and a forth electrode layer 34 made from a metal material such as aluminum, each of which has a thickness of 100 nm or less.

Figure 16C:
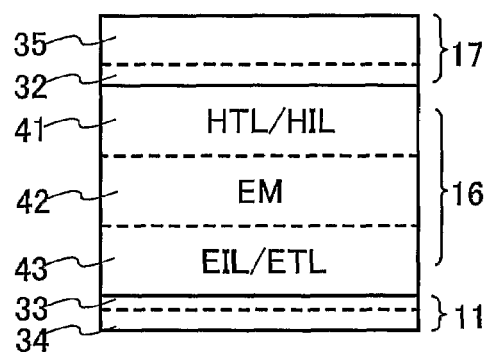

FIG. 16C shows an example in which light is emitted through a first pixel electrode 11 and a layer 16 containing a light emitting substance is formed by sequentially laminating an electron transporting/injecting layer 43, a light emitting layer 42 and a hole injecting/transporting layer 41. A second pixel electrode 17 is formed by laminating, over the layer 16 containing the light emitting substance, a second electrode layer 32 made from a conductive oxide material containing 1 to 15 atomic % silicon oxide; and a first electrode layer 31 made from metal such as aluminum or titanium or the metal and a metal material containing nitrogen at a concentration in the stoichiometric quantity lower than the metal. The first pixel electrode 11 includes a third electrode layer 33 containing an alkali metal such as LiF and CaF or an alkali earth metal and a fourth electrode layer 34 made from a metal material such as aluminum. When either third and fourth electrode layers are formed to have a thickness of 100 nm or less so as to transmit light therethrough, light can be emitted through the first pixel electrode 11.

Figure 16D:
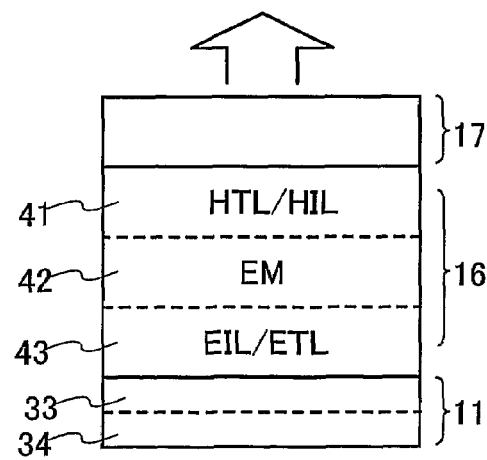

FIG. 16D shows an example in which light is emitted through a second electrode 17 and a layer 16 containing a light emitting substance is formed by sequentially laminating an electron transporting/injecting layer 43, a light emitting layer 42 and a hole injecting/transporting layer 41. A first pixel electrode 11 has a structure similar to that of FIG. 16A and is formed to be thick such that the first pixel electrode can reflect light generated in the layer containing the light emitting substance. The second pixel electrode 17 includes a conductive oxide material containing 1 to 15 atomic % silicon oxide. In this configuration, when the hole injecting/transporting layer 41 is made from metal oxide that is an inorganic material (typically, molybdenum oxide or vanadium oxide), oxygen that is introduced in forming the second electrode layer 32 is supplied so as to improve the hole injecting property, thereby reducing a deriving voltage.

With respect to a light emitting element having the structure as shown in FIG. 16C or 16D, when light is emitted to both directions, i.e., through the first and second pixel electrodes, the first pixel electrode 11 is made from a transparent conductive film with a low work function and the second pixel electrode 17 is made from a transparent conductive film with a high work function. Typically, the first pixel electrode 11 may be formed by using the third electrode layer 33 containing an alkali metal such as LiF and CaF or an alkali earth metal and the fourth electrode layer 34 made from a metal material such as aluminum, each of which has a thickness of 100 nm or less while the second pixel electrode 17 may be formed by using a conductive oxide material containing 1 to 15 atomic % silicon oxide.

Embodiment Mode 11

Pixel circuits of a light emitting display panel as shown in the above embodiment modes and operational configurations thereof will be described in Embodiment Mode 11 with reference to FIGS. 17A to 17F.

Figure 17A:
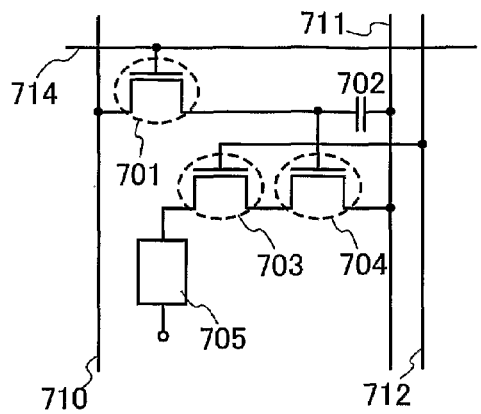
FIGS. 17A to 17F are equivalent circuit diagrams showing configurations of pixels that are applicable to the present invention.

In a pixel as shown in FIG. 17A, a signal line 710, power supply lines 711 and 712 are arranged in columns and a scanning line 714 is arranged in a row. The pixel further includes a switching TFT 701, a driving TFT 703, a current controlling TFT 704, a capacitor element 702 and a light emitting element 705.

Figure 17B:
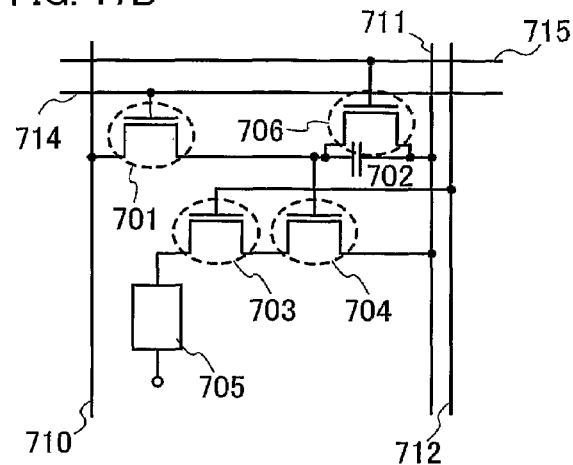
Figure 17C:
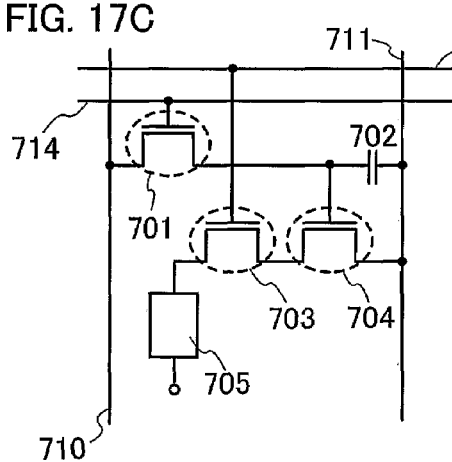

A pixel as shown in FIG. 17C has a similar configuration to the one as shown in FIG. 17A, except that a gate electrode of the driving TFT 703 is connected to a power supply line 712 that is arranged in a row. That is, both pixels in FIGS. 17A and 17C show same equivalent circuit diagrams. However, the respective power supply lines are formed of conductive films placed in different layers, wherein the power supply line 712 is arranged in a column (FIG. 17A) and the power supply line 712 is arranged in a row (FIG. 17C). In order to pay attention to the wirings to which the gate electrodes of the respective driver TFTs 703 are connected and to show the different arrangements of the layers, the equivalent circuit diagrams are individually illustrated in FIGS. 17A and 17C.

In each pixel as shown in FIGS. 17A and 17C, the driving TFT 703 and the current controlling TFT 704 are connected in series. The channel length L(703) and the channel width W(703) of the driving TFT 703 and the channel length L(704) and the channel width W(704) of the current controlling TFT 704 may be set to satisfy the following relation: L(703)/W(703):L(704)/W(704)=5 to 6,000:1.

The driving TFT 703 is operated in a saturation region and serves to control the amount of current flowing through the light emitting element 705, whereas the current controlling TFT 704 is operated in a linear region and serves to control a current supplied to the light emitting element 705. The both TFTs preferably have a same conductivity type in view of the manufacturing process. In the present embodiment mode, n-channel TFTs are used as the TFTs 703 and 704. As the driving TFT 703, a depletion type TFT may be used beside an enhancement type TFT. According to the invention having the above configuration, slight variation in Vgs of the current controlling TFT 704 does not adversely affect the amount of current flowing through the light emitting element 705, since the current controlling TFT 704 is operated in a linear region. That is, the amount of current flowing through the light emitting element 705 can be determined by the driving TFT 703 operated in the saturation region. Accordingly, it is possible to provide a display device in which image quality is improved by improving variation in luminance of the light emitting element due to variation of the TFT characteristics.

The switching TFTs 701 of the respective pixels as shown in FIGS. 17A to 17D control input of video signals to each pixel. When the TFTs 701 are turned ON and video signals are inputted to the pixels, voltage of the video signals is stored in the capacitor elements 702. Although the configurations in which the respective pixels include the capacitor elements 702 are shown in FIGS. 17A and 17C, the invention is not limited thereto. When a gate capacitor or the like can also serve as a capacitor for holding video signals, the capacitor elements 702 are not necessarily provided.

Figure 17D:
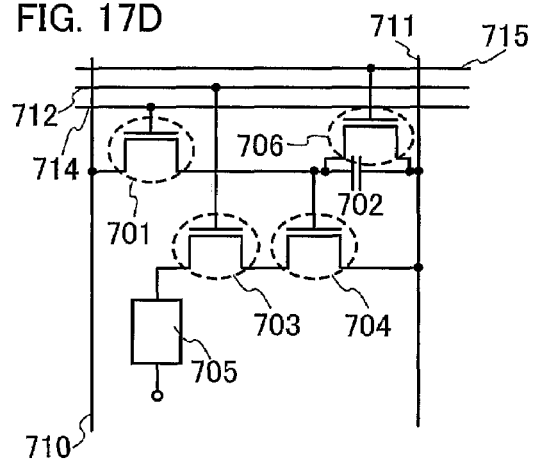

A pixel as shown in FIG. 17B has a similar configuration to the one shown in FIG; 17A, except that a TFT 706 and a scanning line 715 are added thereto. Similarly, a pixel as shown in FIG. 17D has a similar configuration to the one shown in FIG. 17C, except that a TFT 706 and a scanning line 715 are added thereto.

The TFT 706 is controlled to be turned ON/OFF by the newly provided scanning line 715. When the TFT 706 is turned ON, charges held in the capacitor element 702 are discharged, thereby turning the current controlling TFT 704 OFF. That is, supply of a current to the light emitting element 705 can be forcibly stopped by providing the TFT 706. The TFT 706 can, thus, be referred to as an erasing TFT. Therefore, a lighting period can start simultaneously with or immediately after a writing period starts before signals are written in all the pixels according to the configurations as shown in FIGS. 17B and 17D, and hence, the duty ratio can be improved.

Figure 17E:
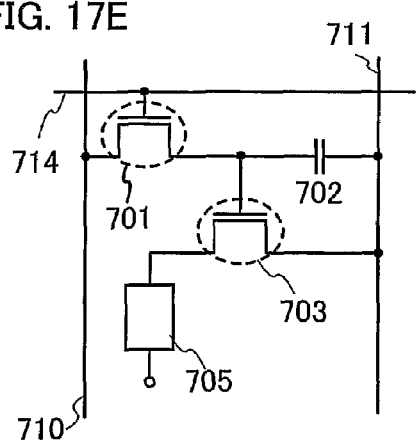
Figure 17F:
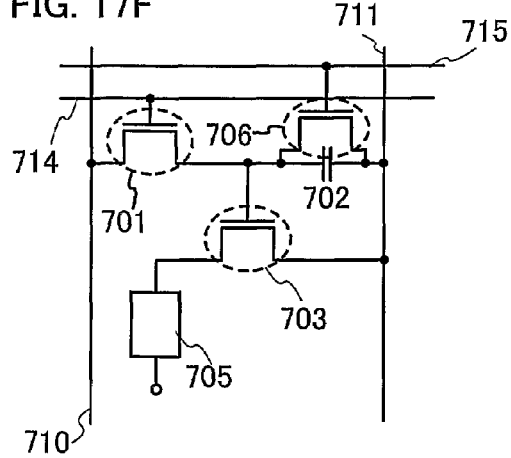

In a pixel as shown in FIG. 17E, a signal line 710 and a power supply line 711 are arranged in columns, and a scanning line 714 is arranged in a row. The pixel further includes a switching TFT 701, a driving TFT 703, a capacitor element 702 and a light emitting element 705. A pixel as shown in FIG. 17F has a similar configuration to the one as shown in FIG. 17E, except that a TFT 706 and a scanning line 715 are added thereto. Further, the configuration depicted in FIG. 17F also allows a duty ratio to be improved by providing the TFT 706.

In particular, when forming a thin film transistor having an amorphous semiconductor and the like as well as the above embodiment modes, the size of a semiconductor film for a driving TFT is preferably increased. Therefore, in views of an aperture ratio, a pixel having a small number of TFTs as shown in FIG. 17E or FIG. 17F is preferably employed.

In the case where the pixel density is increased, such the active matrix light emitting device is considered to be advantageous since TFTs are provided in each pixel so that it can be driven at low voltage. Meanwhile, a passive matrix light emitting device in which TFTs are provided in each column can be formed. Since the TFTs are not provided in each pixel, the passive matrix light emitting device has a high aperture ratio.

In the light emitting device of the invention, the method for driving screen display is not particularly limited. For example, a dot sequential driving method, a line sequential driving method, a surface sequential driving method and the like may be used. The line sequential driving method is typically used, and a time division gray scale driving method or a surface area gray scale driving method may also be employed arbitrarily. Further, a source line of the light emitting display device may be input with either analog signals or digital signals. A driver circuit and the like may be designed arbitrarily according to the image signals.

Display devices using digital video signals are classified into one in which video signals are input to a light emitting element at a constant voltage (CV), and another one in which video signals are input to a light emitting element at a constant current (CC). The display devices in which video signals are input to the light emitting element at a constant voltage (CV) are further classified into one in which a constant voltage is applied to a light emitting element (CVCV), and another one in which a constant current is supplied to a light emitting element (CVCC). The display devices in which video signals are input to the light emitting element at a constant current (CC) is still classified into one in which a constant voltage is applied to a light emitting element (CCCV), and another one in which a constant current is supplied to a light emitting element (CCCC).

As set forth above, various types of pixel circuits can be employed.

Embodiment Mode 12

Methods for mounting driver circuits (e.g., a signal line driver circuit 1402 and scanning line driver circuits 1403a and 1403b) over a display panel as shown in the above embodiment modes will be described in Embodiment Mode 12 with reference to FIGS. 18A to 18C.

Figure 18A:
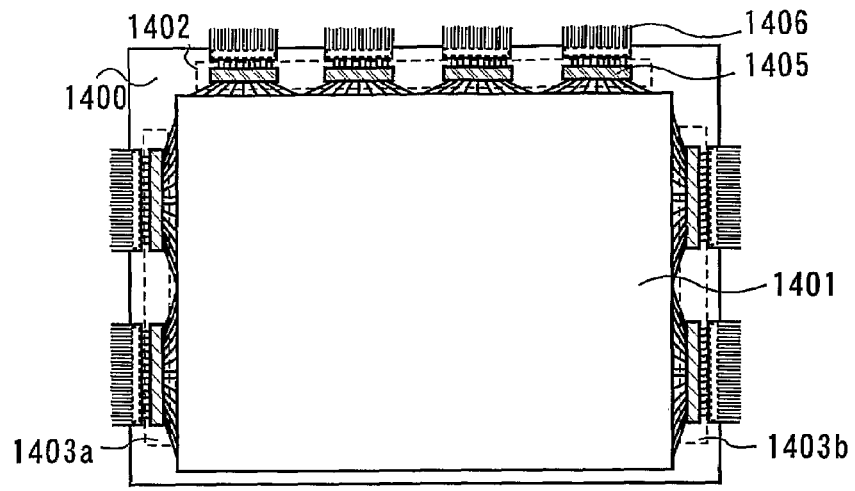
FIGS. 18A to 18C are top views showing methods for mounting driver circuits of a display device according to the invention.

As shown in FIG. 18A, a signal line driver circuit 1402 and scanning line driver circuits 1403a and 1403b are mounted in the periphery of a pixel portion 1401. In FIG. 18A, IC chips 1405 are mounted over a substrate 1400 as the signal line driver circuit 1402, the scanning line driver circuits 1403a and 1403b, and the like by the COG technique. Further, the IC chips and external circuits are connected to one another through FPCs (flexible printed circuits) 1406.

Figure 18B:
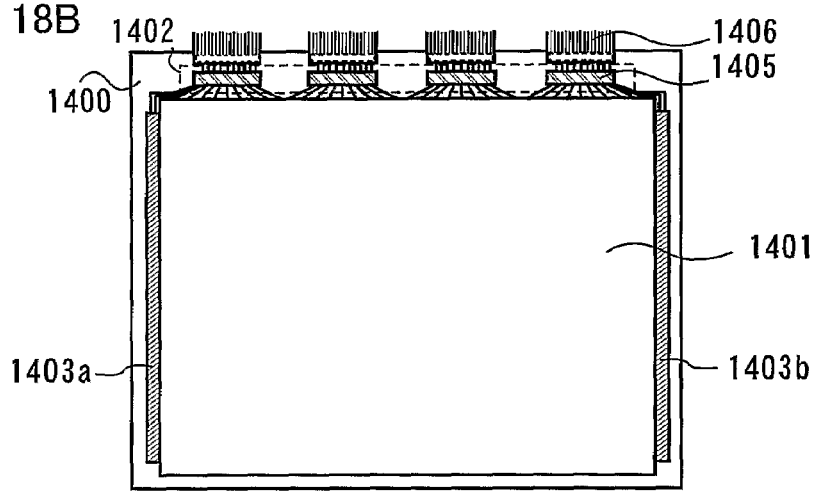

When a TFT is formed of an SAS or a crystalline semiconductor as shown in FIG. 18B, the pixel portion 1401, the scanning line driver circuits 1403a and 1403b and the like can be integrally formed over a substrate and the signal line driver circuit 1402 or the like can be mounted as IC chips separately. In FIG. 18B, the IC chips 1405 are formed as the signal line driver circuit 1402 over the substrate 1400 by the COG technique. Further, the IC chips and external circuits are connected to one another through the FPCs 1406.

Figure 18C:
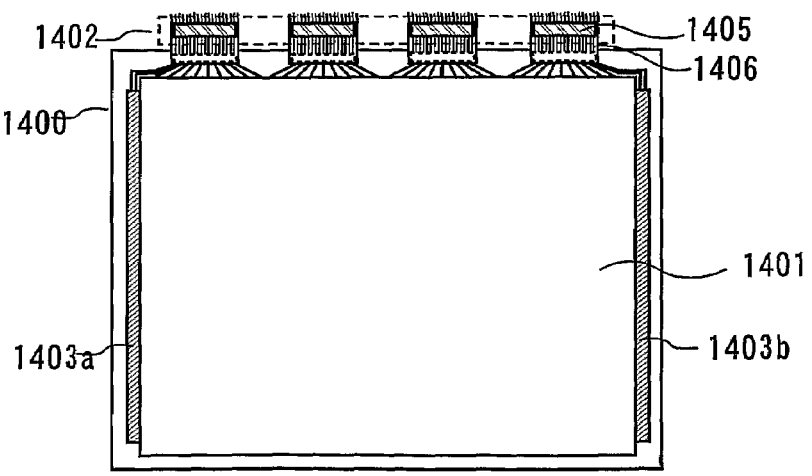

Also, as shown in FIG. 18C, the signal line driver circuit 1402 or the like is sometimes mounted by the TAB technique as substitute for the COG technique. The IC chips and external circuits are connected to one another through the FPCs 1406. Although the signal line driver circuit is mounted by the TAB technique in FIG. 18C, the scanning line driver circuits may be mounted by the TAB technique.

When the IC chips are mounted by the TAB technique, the pixel portion can be provided in a large area of the substrate, thereby narrowing a flame region.

An IC chip is formed by using a silicon wafer. Alternatively, an IC, which is formed over a glass substrate (hereinafter, referred to as a driver IC), may be provided, instead of the IC chip. Since the IC chip is taken out of a circular silicon wafer, the shape of a mother substrate is limited. On the other hand, since the driver IC is formed using glass as a mother substrate, the shape of the mother substrate is not limited so that the productivity can be improved. Accordingly, the shape and the size of the driver IC can arbitrarily be determined. For example, when the driver IC is formed to have a longitudinal length of 15 to 80 mm, the number of driver ICs to be required can be reduced, as compared with the case of mounting IC chips. As a result, the number of connection terminals can be reduced, and hence, the manufacturing yield can be improved.

A driver IC can be formed by using an amorphous semiconductor formed over a substrate. The amorphous semiconductor may be formed by being irradiated with continuous wave laser beam. A semiconductor film obtained by being irradiated with continuous wave laser beam includes a large-size crystal grain with few crystal defects. Consequently, a transistor having such the semiconductor film is driven at high speed and have excellent mobility and response speed so that the transistor is preferable as a driver IC.

Embodiment Mode 13

Methods for mounting driver circuits (a signal line driver circuit 1402 and scanning line driver circuits 1403a and 1403b) over a display panel as shown in the above embodiment modes will be described in Embodiment Mode 13 with reference to FIGS. 19A to 19D. As the mounting methods, a connection method using an anisotropic conductive material, a wire bonding technique and the like may be employed. Examples of the mounting methods are illustrated in FIGS. 19A to 19D. In the present embodiment mode, examples of using driver ICs as the signal line driver circuits 1402 and the scanning line driver circuits 1403a and 1403b will be shown. As substitute for the driver ICs, IC chips can arbitrarily used.

Figure 19A:
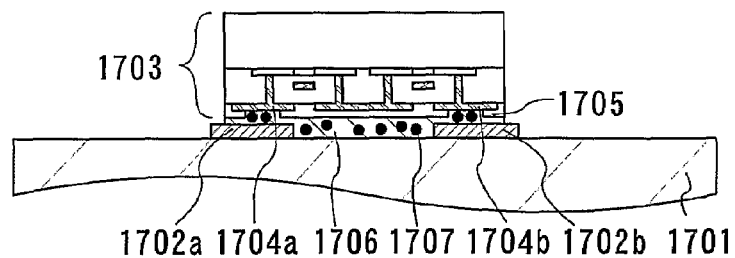
FIGS. 19A to 19D are cross sectional views showing methods for mounting driver circuits of a display device according to the invention.

FIG. 19A shows an example in which an IC driver 1703 is mounted over an active matrix substrate 1701 by using an anisotropic conductive material. Various wirings such as a source or drain wiring (no shown) and electrode pads 1702a and 1702b, which are extraction electrodes of the wirings, are formed over the active matrix substrate 1701.

Connection terminals 1704a and 1704b are provided on the surface of the driver IC 1703 and a protective insulating film 1705 is formed in the periphery thereof.

The driver IC 1703 is fixed to the surface of the active matrix substrate 1701 with an anisotropic conductive adhesive agent 1706. The connection terminals 1704a and 1704b and the electrode pads 1702a and 1702b are electrically connected to one another with conductive particles 1707 contained in the anisotropic conductive adhesive agent. The anisotropic conductive adhesive agent is adhesive resin containing conductive particles (with a grain diameter of about 3 to 7 μm) dispersed therein. For instance, epoxy resin, phenol resin and the like can be cited as the anisotropic conductive adhesive agent. Further, conductive particles (with a grain diameter of about several μm to several hundreds μm) are made from alloy particles of one element or a plurality of elements selected from gold, silver, copper, palladium and platinum. Alternatively, particles having multilayered structure of these elements may be used. Furthermore, particles in which resin particles are coated with one element or a plurality of elements selected from gold, silver, copper, palladium and platinum may be employed.

As substitute for the anisotropic conductive adhesive agent, an anisotropic conductive film may be used by transferring it over a base film. Conductive particles are also dispersed in the anisotropic conductive film as well as the anisotropic conductive adhesive agent. By adjusting the size and density of the conductive particles 1707 mixed in the anisotropic conductive adhesive agent 1706, the driver IC can be mounted over the active matrix substrate. This mounting method is suitable for mounting the driver ICs as shown in FIG. 18A and FIG. 18B.

Figure 19B:
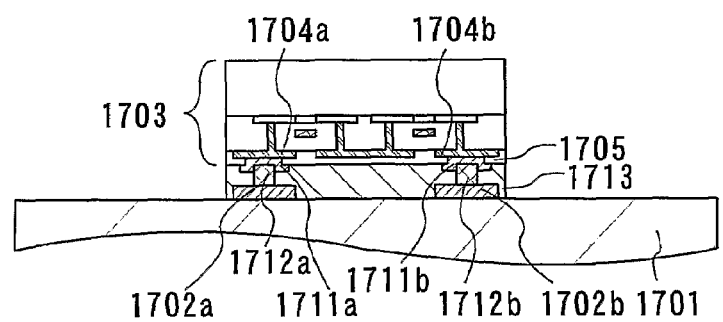

FIG. 19B shows an example of another mounting method utilizing shrinkage behavior of organic resin. Buffer layers 1711a and 1711b are formed on the surface of a connection terminal for a driver IC by using Ta, Ti or the like. Au with a thickness of about 20 μm is formed thereon by the electroless deposition or the like to form bumps 1712a and 1712b. Light-curing insulating resin 1713 is interposed between the driver IC and the active matrix substrate. By utilizing the shrinkage behavior of the resin that is cured by being irradiated with light, the driver IC can be mounted over the active matrix substrate. This mounting method is suitable for mounting the driver ICs as shown in FIG. 18A and FIG. 18B.

Figure 19C:
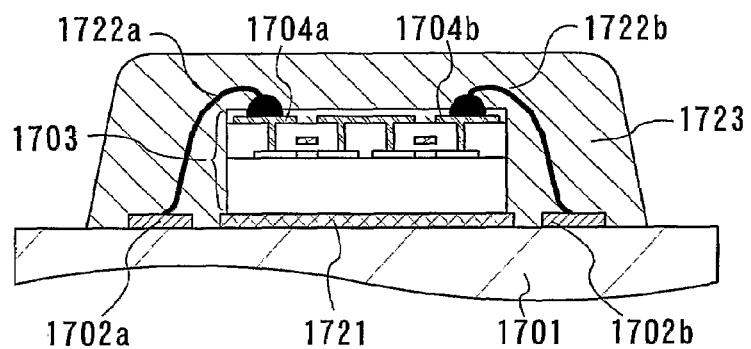

Also, as shown in FIG. 19C, a driver IC 1703 may be fixed to the active matrix substrate 1701 with an adhesive agent 1721 and connection terminals of a CPU and the electrode pads 1702a, 1702b over a wiring substrate may be connected to one another by wires 1722a and 1722b. Then, the driver IC is sealed with organic resin 1723. This mounting method is suitable for mounting the driver ICs as shown in FIGS. 18A and 18B.

Figure 19D:
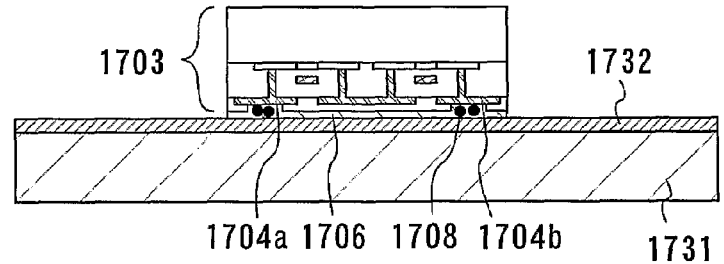

Additionally, as shown in FIG. 19D, the driver IC 1703 may be provided through a wiring 1732 formed over an FPC (flexible printed circuit) 1731 and an anisotropic conductive adhesive agent 1706 containing conductive particles 1708. This structure is extremely effective in the case of applying it to an electronic appliance having a housing with a limited size such as a cellular phone. This mounting method is suitable for mounting the driver ICs as shown in FIG; 18C.

Further, the method for mounting the driver ICs is not particularly limited, and the known COG technique, wire bonding technique, TAB technique, reflow treatment using a solder bump, or the like can be employed. When performing the reflow treatment, a substrate used for a driver IC or an active matrix substrate is preferably made from high heat resistant plastic, typically, a polyimide substrate, an HT substrate (manufactured by Nippon Steel Chemical Co., Ltd.), ARTON (manufactured by JSR Corporation) formed by norbornene resin with a polar radical.

Embodiment Mode 14

In a light emitting display panel as described in Embodiment Mode 11, the present embodiment mode will describe a case in which a signal line driver circuit with a semiconductor layer made from an SAS is formed over a substrate 1400 as shown in FIGS. 18B and 18C.

Figure 20:
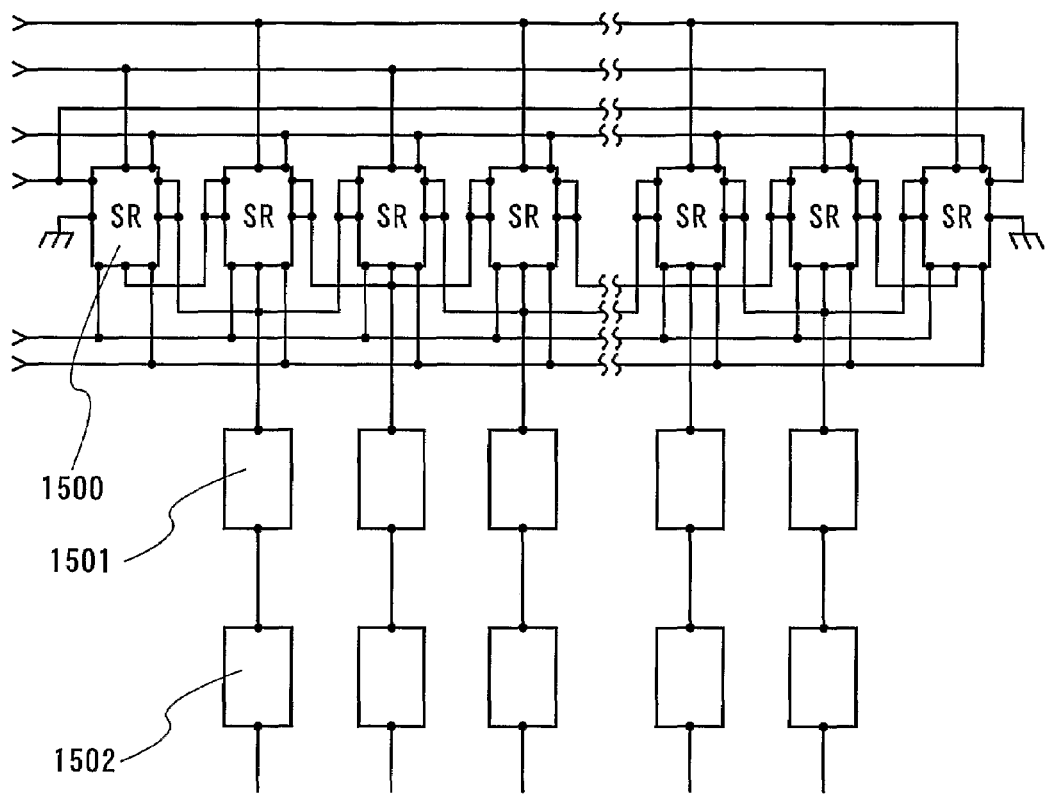
FIG. 20 is a diagram showing a circuit structure in the case where a scanning line driver circuit of a display panel according to the invention is formed by using a TFT.

FIG. 20 is a block diagram showing a scanning line driver circuit formed using an n-channel TFT that uses an SAS with an electron field-effect mobility of 1 to 15 $cm^2/V \cdot sec$.

In FIG. 20, a block denoted by 1500 corresponds to a pulse output circuit outputting a sampling pulse for one stage. A shift register includes n pieces of pulse output circuits. Pixels are connected to the ends of buffer circuits 1501 and 1502.

Figure 21:
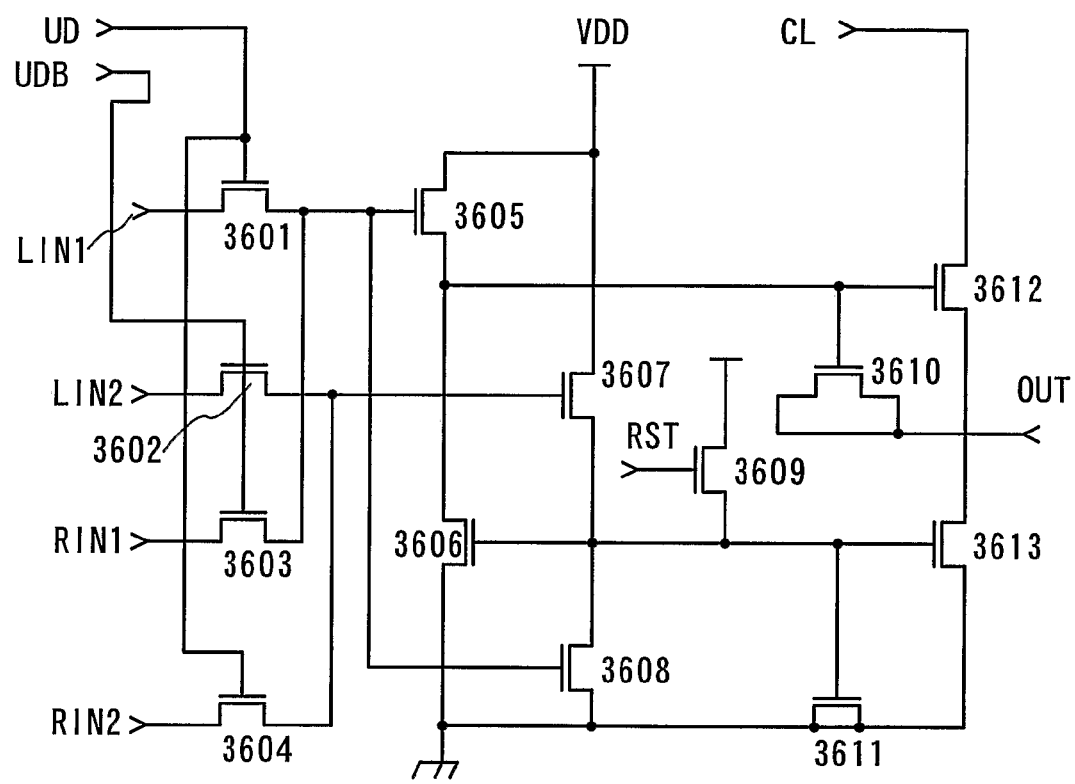
FIG. 21 is a circuit diagram showing a circuit structure in the case of forming a scanning line driver circuit of a display panel according to the invention by using a TFT (a shift register circuit)

FIG. 21 shows a specific configuration of a pulse output circuit 1500, wherein the circuit includes n-channel TFTs 3601 to 3613. In this case, the sizes of the TFTs may be determined in consideration of operation characteristics of the n-channel TFTs using an SAS. For instance, when the channel length is set to be 8 μm, the channel width can be set to be in the range of 10 to 80 μm.

Figure 22:
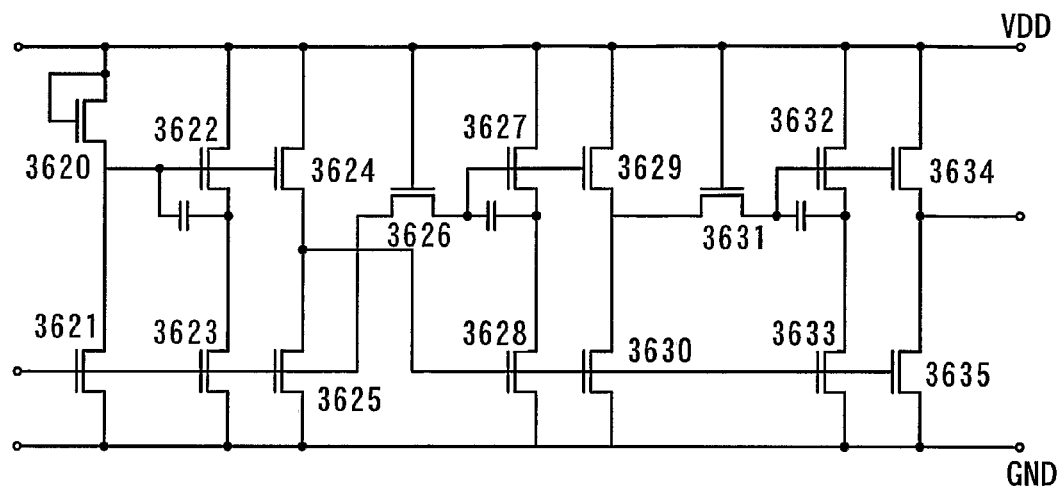
FIG. 22 is a circuit diagram showing a circuit structure in the case of forming a scanning line driver circuit of a display panel according to the invention by using a TFT (a buffer circuit)

Further, a specific configuration of a buffer circuit 1501 is shown in FIG. 22. Similarly, the buffer circuit includes n-channel TFTs 3620 to 3635. In this case, the sizes of the TFTs may be determined in consideration of operation characteristics of the n-channel TFTs using an SAS. For example, when the channel length is set to be 10 μm, the channel width can be set to be in the range of 10 to 1,800 μm.

Embodiment Mode 15

Figure 24:
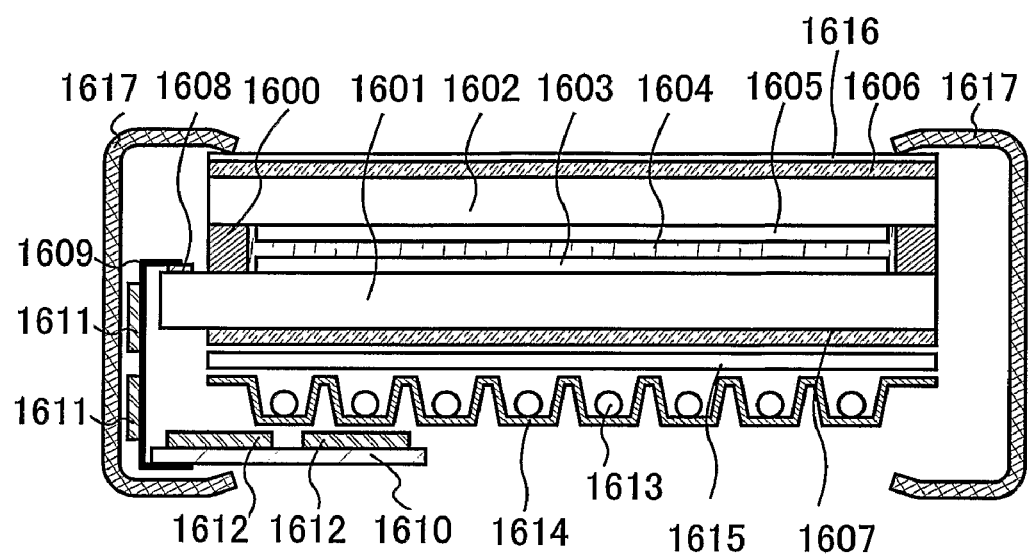
FIG. 24 is a diagram showing a structure of a liquid crystal display module according to the invention.

A display module will be described in the present embodiment mode. As an example of the display module, an example of a liquid crystal module is shown in FIG. 24.

An active matrix substrate 1601 and a counter substrate 1602 are attached to each other with a sealing material 1600. A pixel portion 1603 and a liquid crystal layer 1604 are provided therebetween to form a display region.

A colored layer 1605 is required to perform color display. In the RGB system, colored layers corresponding to respective colors of red, green and blue are provided in accordance with pixels to be formed. Polarizing plates 1606 and 1607 are provided over each outer surface of the active matrix substrate 1601 and the counter substrate 1602. Further, a protective film 1616 is formed on the surface of the polarizing plate 1606 so as to mitigate damage from the outside.

A connection terminal 1608 provided over the active matrix substrate 1601 is connected to a wiring substrate 1610 through an FPC 1609. A pixel driver circuit (e.g., an IC chip, a driver IC and the like) 1611 is provided over the FPC or a connection wiring. An external circuit 1612 such as a control circuit and a power supply circuit is incorporated in the wiring substrate 1610.

A cold-cathode tube 1613, a reflecting plate 1614 and an optical film 1615 are backlight units and they serve as light sources such that light is projected through a liquid crystal display panel. A liquid crystal panel, the light sources, the wiring substrate, the FPC and the like are held and protected by bezels 1617.

Further, any one of Embodiment Modes 1 through 7 can be applied to the present embodiment mode.

Embodiment Mode 16

An example of a cross sectional view of a light emitting display module will be described as an example of a display module in the present embodiment mode with reference to FIGS. 23A to 23C.

Figure 23A:
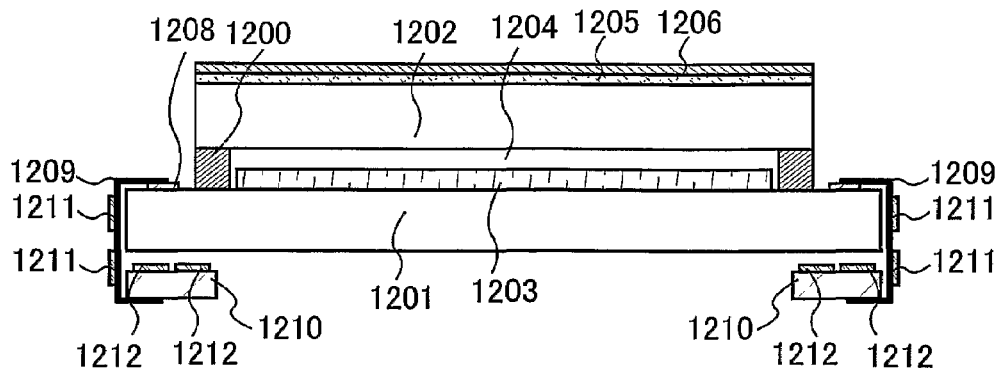
FIGS. 23A to 23C are diagrams showing structures of a light emitting display module according to the invention.

FIG. 23A illustrates a cross section of a light emitting display module in which an active matrix substrate 1201 and a counter substrate 1202 are attached to each other with a sealing material 1200. A pixel portion 1203 is provided between the active matrix substrate and the counter substrate to form a display region.

A space 1204 is provided between the counter substrate 1202 and the pixel portion 1203. An inert gas such as nitrogen gas is filled in the space or transparent resin with a high water-absorbing property is formed therein so that moisture or oxygen can further be prevented from penetrating thereinto. Also, resin with a high light-transmitting property and a high water-absorbing property may be formed. By using the resin with the light-transmitting property, when light generated from a light emitting element is emitted toward the counter substrate, the light emitting display module can be formed without reducing the light transmittance.

Further, in order to improve contrast, a polarizing plate or a circular polarizing plate (i.e., a polarizing plate, a ¼λ plate and a ½λ plate) may be provided at least in the pixel portion of the module. When display is recognized from the counter substrate 1202, a ¼λ plate, a ½λ plate 1205 and a polarizing plate 1206 may be provided in this order over the surface of the counter substrate 1202. In addition, an antireflection film may be provided over the polarizing plate.

Also, when display is recognized from both the counter substrate 1202 and the active matrix substrate 1201, another ¼λ plate, another ½λ plate and another polarizing plate is preferably provided on the surface of the active matrix substrate in the same way.

A print substrate 1210 is connected to the connection terminal 1208 provided over the active matrix substrate 1201 through the FPC 1209. A pixel driver circuit (e.g., an IC chip, a driver IC and the like) 1211 is provided over the FPC or the connection wiring. An external circuit 1212 such as a control circuit and a power supply circuit is incorporated in the print substrate 1210.

Figure 23B:
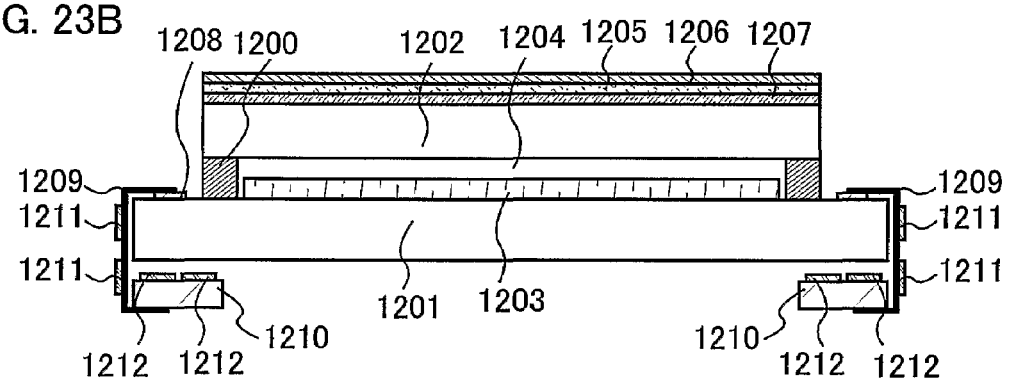

As shown in FIG. 23B, a colored layer 1207 may be provided between the pixel portion 1203 and the polarizing plate or between the pixel portion and the circular polarizing plate. In this case, a light emitting element, which can emit white light, is provided in the pixel portion and colored layers exhibiting R, G and B are separately provided so that full-color display can be carried out. Alternatively, a light emitting element, that can emit blue light, is provided in a pixel portion and a color conversion layer or the like is separately provided so that full-color display can be achieved. Furthermore, respective pixel portions, light emitting elements emitting red, green and blue light can be formed along with a colored layer. Such a display module has high purity of respective R, G and B, and hence, fine display can be performed.

Figure 23C:
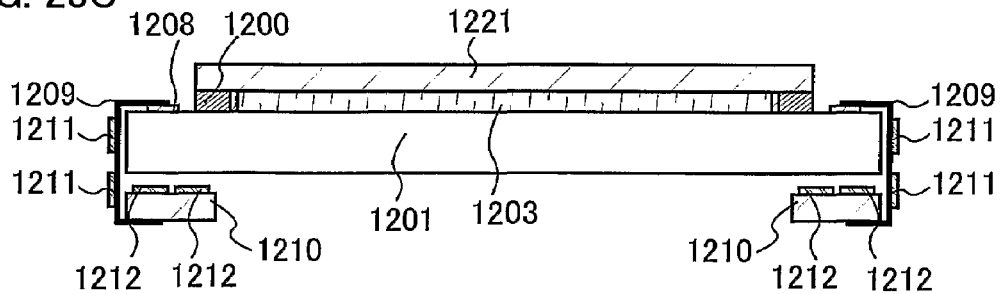

Differing from FIG. 23A, FIG. 23C illustrates a case in which the active matrix substrate and the light emitting element are sealed by using a protective film 1221 such as a film, resin and plastic without employing a counter substrate. The protective film 1221 is provided to cover a second pixel electrode of the pixel portion 1203. As the protective film, an organic material such as epoxy resin, urethane resin and silicon resin can be used. Alternatively, a polymer material may be dropped by the droplet discharging method to form the protective film. In this embodiment mode, epoxy resin is discharged by using a dispenser and then dried. Additionally, a counter substrate may be provided over the protective film. Another structure is identical to that of FIG. 23A.

When the active matrix substrate and the light emitting element are sealed without using the counter substrate in such a manner, a display device can be made lighter, smaller and thinner.

Although the print substrate 1210 is mounted over the module of the present embodiment mode by using the FPC 1209, the present embodiment mode is not particularly limited to this structure. Alternatively, the pixel driver circuit 1211 and the external circuit 1212 may directly be mounted over the substrate by using the COG (chip on glass) technique.

Furthermore, any one of Embodiment Modes 1 to 7 can be applied to the present embodiment mode. Although the examples of the liquid crystal display module and the light emitting display module are shown as the display module, the present embodiment mode is not limited thereto. Therefore, the present embodiment mode can arbitrarily be applied to a DMD (digital micromirror device), a PDP (plasma display panel), an FED (field emission display), an electrophoretic migration display device (electronic paper) and the like.

Embodiment Mode 17

According to the present invention, a circuit highly integrated with a semiconductor element having a microscopic structure, typically, a semiconductor device such as a signal line driver circuit, a controller, a CPU, a converter of an audio processing circuit, a power supply circuit, a transmitting/receiving circuit, a memory and an amplifier of an audio processing circuit can be formed. Furthermore, a system-on-chip with high speed, high reliability and low power consumption in which a circuit configuring one system (functional circuit) such as an MPU (micro computer), a memory and an I/O interface is mounted on a monolithic can be formed.

Embodiment Mode 18

Figure 26:
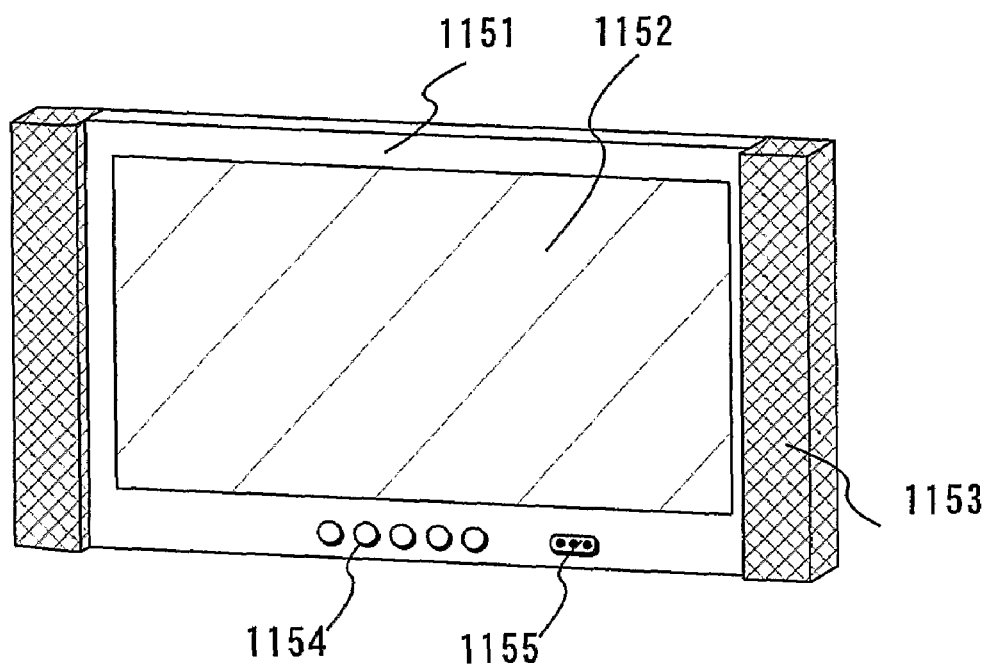
FIG. 26 is a view showing an example of an electronic appliance.
Figure 27A:
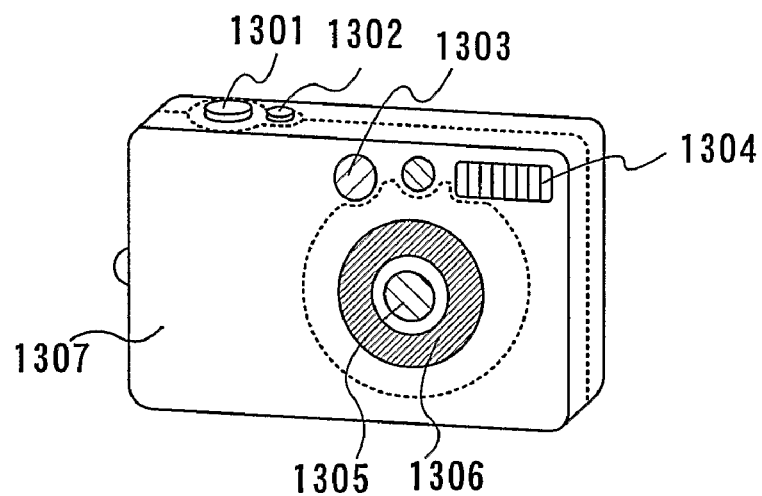
FIGS. 27A and 27B are views showing an example of an electronic appliance.
Figure 27B:
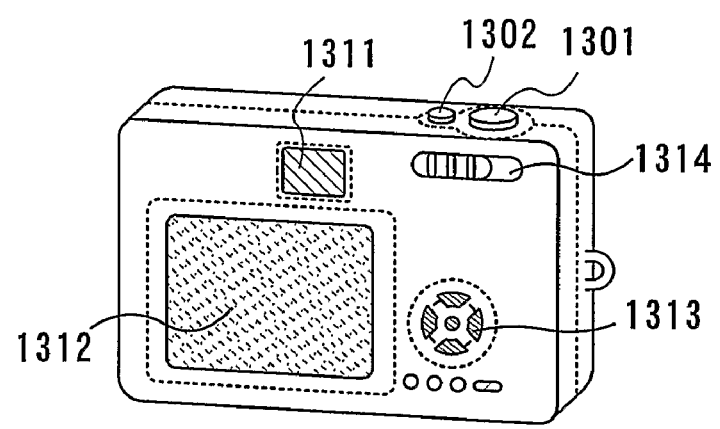

Various kinds of electronic appliances can be manufactured by incorporating a semiconductor device according to the above embodiment modes into a housing. The electronic appliances include a television, a camera such as a video camera and a digital camera, a goggle type display (a head-mounted display), a navigation system, an audio reproduction device (such as a car audio system and an audio component system), a personal computer, a game machine, a portable information terminal (such as a mobile computer, a cellular telephone, a portable game machine and an electronic book), an image reproduction device provided with a recording medium (typically, a device which can reproduce the recording medium such as a digital versatile disc (DVD) and display images thereof), and the like. As representative examples of these electronic appliances, a block diagram and a perspective view of a television are shown in FIG. 25 and FIG. 26, respectively, while perspective views of a digital camera are shown in FIGS. 27A and 27B.

Figure 25:
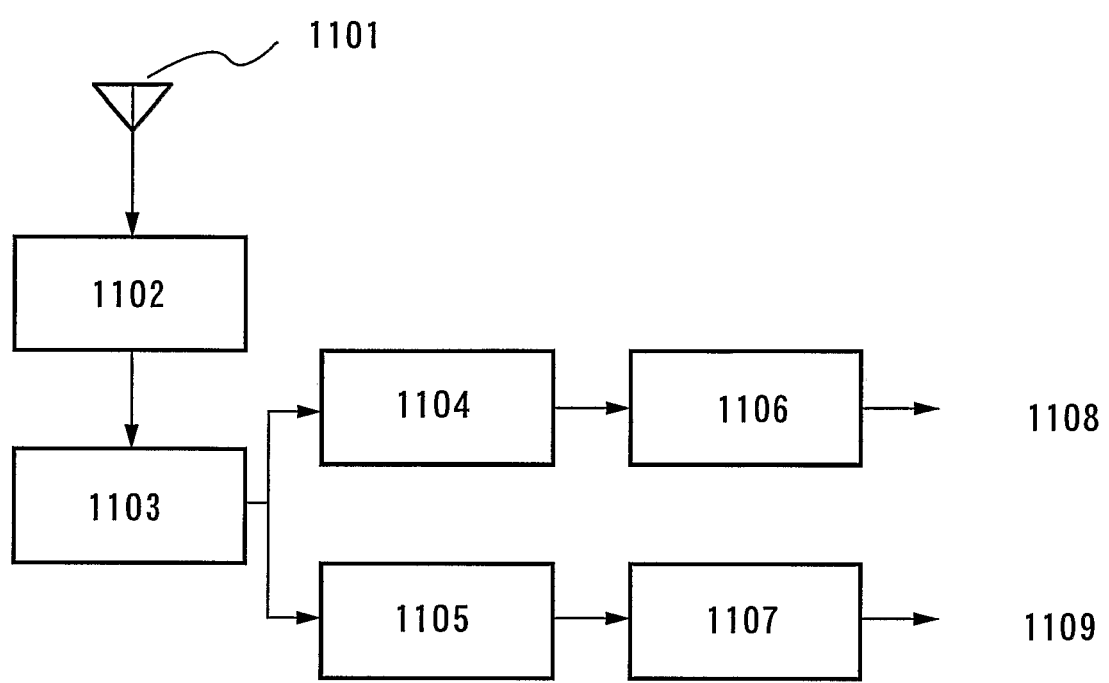
FIG. 25 is a block diagram explaining a structure of an electronic appliance.

FIG. 25 is a block diagram showing a general structure of a television that receives analog television broadcasting. In FIG. 25, the airwaves for television broadcasting received by an antenna 1101 are input in a tuner 1102. The tuner 1102 generates and outputs intermediate frequency (IF) signals by mixing the high frequency television signals input by the antenna 1101 and locally-oscillating frequency signals that are controlled in accordance with a predetermined reception frequency.

The IF signals output from the tuner 1102 are amplified up to a required amount of voltage by an intermediate frequency amplifier (IF amplifier) 1103. Thereafter, the amplified IF signals are detected by an image detection circuit 1104 and an audio detection circuit 1105. The signals output from the image detection circuit 1104 are divided into luminance signals and color signals by an image processing circuit 1106. Further, the luminance signals and the color signals are subjected to the predetermined image signal processing to become image signals. Consequently, the image signals are output to an image output unit 1108 such as a DMD (digital micromirror device), a PDP (plasma display panel), an FED (field emission display), and an electrophoretic display device (e.g., an electronic paper). Further, a television employing a liquid crystal display device as its display device becomes a liquid crystal television while a television employing a light emitting display device as its display device becomes an EL television. This is same in the case of using another display device.

The signals output from the audio detection circuit 1105 are subjected to processing such as FM demodulation in an audio processing circuit 1107 to become audio signals. The audio signals are then amplified arbitrarily so as to be output to an audio output unit 1109 such as a speaker.

The television according to the present invention may be applicable to digital broadcasting such as digital terrestrial broadcasting, cable digital broadcasting and BS digital broadcasting, besides analog broadcasting such as regular broadcasting in VHF band, in UHF band or the like, cable broadcasting and BS broadcasting.

FIG. 26 is a perspective view showing the television seen from the front thereof, including a housing 1151; a display portion 1152; speaker units 1153; an operational portion 1154; a video input terminal 1155; and the like. The television shown in FIG. 26 includes the structure as shown in FIG. 25.

The display portion 1152 is an example of the image output unit 1108 in FIG. 25, and serves to display images.

The speaker units 1153 are examples of the audio output unit in FIG. 25, and output sound therefrom.

The operational portion 1154 is provided with a power source switch, a volume switch, a channel select switch, a tuning switch, a selection switch and the like so as to turn on and off the television, select images, control sound, select a tuner and the like, respectively. In addition, the above-mentioned selections and operations can also be carried out by a remote-control unit, though not illustrated in the drawing.

The video input terminal 1155 inputs image signals into the television from an external portion such as a VTR, a DVD and a game machine.

In the case of a wall-mounted television, a hanging portion is provided on the rear of the body thereof.

By applying the display device that is an example of a semiconductor device according to the invention to the display portion of the television, a thin, lightweight television having an excellent impact resistance property may be manufactured at low cost, providing high throughput and yield. When a semiconductor device according to the invention is applied to a CPU for controlling an image detection circuit, an image processing circuit, an audio detection circuit and an audio processing circuit of a television, a thin, lightweight television with an excellent impact resistance property can be manufactured at low cost, providing high throughput and yield. As a consequence, such a television is widely applicable to wall-mounted televisions, in particular, to large-size display mediums such as information display boards used in railway stations, airports, etc., and advertisement display boards on the streets.

FIGS. 27A and 27B are diagrams showing an example of the digital camera. FIG. 27A is a perspective view of the digital camera seen from the front thereof, while FIG. 27B is a perspective view of the digital camera seen from the rear thereof. In FIG. 27A, the digital camera includes a release button 1301, a main switch 1302, a viewfinder window 1303, flash 1304, a lens 1305, a lens barrel 1306 and a housing 1307.

In FIG. 27B, the digital camera further includes a viewfinder eyepiece 1311, a monitor 1312, an operational button 1313 and a switch 1314.

Upon depressing the release button 1301 halfway, a focus adjustment mechanism and an exposure adjustment mechanism are operated. Subsequently, depressing the release button all the way releases a shutter The digital camera is turned on or off by pressing or rotating the main switch 1302.

The viewfinder window 1303 is disposed above the lens 1305 on the front face of the digital camera, and a shooting range and a focusing point are checked through the viewfinder eyepiece 1311 as shown in FIG. 27B and the viewfinder window.

The flash 1304 is disposed at the upper portion of the front face for the digital camera. In the case of photographing a subject of the low luminance level, when depressing the release button, the shutter is released to take the picture simultaneously with flushing a light.

The lens 1305 is provided in the front of the digital camera. The lens is made of a focusing lens, a zoom lens and the like. An optical shooting system includes the lens along with a shutter and an aperture, which are not illustrated in the drawing. An image pickup device such as a CCD (charge coupled device) is provided at the rear of the lens.

The lens barrel 1306 is used for shifting the lens position so as to adjust the focusing lens, the zoom lens and the like on a subject. To take the picture, the lens barrel is protruded from the body so that the lens 1305 is shifted toward a subject. When carrying the digital camera, the lens 1305 is stored inside the main body to be reduced in size. Further, although the lens can be zoomed in to enlarge a subject by protruding the lens barrel toward the subject in the present embodiment, the present embodiment is not limited to the structure. The embodiment can also be applicable to a digital camera that can take close-up a picture without zooming a lens due to a structure of an optical shooting system inside the housing 1307.

The viewfinder eyepiece 1311 is provided at the upper portion of the rear of the digital camera, through which a shooting range and a focusing point are checked by sight.

The operational button 1313 represents a button with various kinds of functions and is provided on the rear of the digital camera. The operational button includes a setup button, a menu button, a display button, a functional button, a selection button and the like.

By utilizing the display device that is one embodiment mode of a semiconductor according to the invention as a monitor of the digital camera, a thinner, portable digital camera can be manufactured at low cost, providing high throughput and yield. A semiconductor device according to the present invention can be applied to a CPU for processing in response to input operation of various functional buttons, a main switch, a release button etc.; a CPU for controlling various circuits such as a circuit for performing autofocusing and autofocusing adjustment, a circuit for controlling electric flash drive, a timing control circuit for controlling CCD drive, an image pickup circuit for generating an image signal from a signal that is converted photoelectrically by an image pickup device such as a CCD, an A/D converter for converting an image signal generated in an image pickup circuit into a digital signal, and a memory interface for writing in/reading in image data in a memory. The application of the present invention permits fabrication of a thinner, portable digital camera at low cost with excellent throughput and yield.

The present application is based on Japanese Priority Application No. 2004-088848 filed on Mar. 25, 2004 with the Japanese Patent Office, the entire contents of which are hereby incorporated by reference.

The invention claimed is:

1. A method for manufacturing a thin film transistor, comprising the steps of:
    forming a gate electrode layer over a substrate having an insulating surface;
    forming a gate insulating layer over the gate electrode layer;
    forming a first semiconductor layer over the gate insulating layer;
    forming a second semiconductor layer containing an impurity of one conductivity type over the first semiconductor layer;
    forming a first mask over the second semiconductor layer;
    etching the first semiconductor layer and the second semiconductor layer by using the first mask;
    removing the first mask;
    forming a second mask over the second semiconductor layer;
    etching a portion of the second semiconductor layer by using the second mask to expose a first region of the first semiconductor layer;
    applying a solution over the second mask and the exposed region of the first semiconductor layer to give a first wettability thereto;
    removing the second mask after applying the solution to expose a second region of the second semiconductor layer; and
    forming a wiring over the second region by a droplet discharging method,
    wherein the second region has a higher wettability than the first wettability.

2. A method for manufacturing a thin film transistor, comprising the steps of:
    forming a gate electrode layer over a substrate having an insulating surface;
    forming a gate insulating layer over the gate electrode layer;
    forming a first semiconductor layer over the gate insulating layer;
    forming a channel protection layer over the first semiconductor layer;
    forming a second semiconductor layer containing an impurity of one conductivity type over the first semiconductor layer and the channel protection layer;
    forming a first mask over the second semiconductor layer;
    etching the first semiconductor layer and the second semiconductor layer by using the first mask;
    removing the first mask;
    forming a second mask over the second semiconductor layer;
    etching a portion of the second semiconductor layer by using the second mask to expose a first region of the channel protection layer;
    applying a solution over the second mask and the exposed region of the channel protection layer to give a first wettability thereto;
    removing the second mask after applying the solution to expose a second region of the second semiconductor layer; and
    forming a wiring over the second region by a droplet discharging method,
    wherein the second region has a higher wettability than the first wettability.

3. The method for manufacturing the thin film transistor according to claim 1 or claim 2, wherein the second mask is formed by applying a planarizing film and etching back the planarizing film.

4. The method for manufacturing the thin film transistor according to claim 1 or claim 2, wherein the second mask is formed by applying a negative resist and exposing the negative resist to light through the substrate from a rear side of the substrate opposite to the gate electrode by using the gate electrode as a mask.

5. The method for manufacturing the thin film transistor according to claim 1 or claim 2, wherein the second mask is formed by applying a positive resist and exposing the positive resist to light through the substrate from a rear side of the substrate opposite to the gate electrode.

6. The method for manufacturing the thin film transistor according to claim 1 or claim 2, wherein the step of forming the gate electrode layer, comprising:
    forming a conductive base layer over the substrate;
    forming the gate electrode layer over the conductive base layer; and
    oxidizing the conductive base layer that is not overlapped with the gate electrode layer to be insulated.

7. The method for manufacturing the thin film transistor according to claim 1 or claim 2, wherein the step of forming the gate electrode layer, comprising:
    forming a conductive base layer over the substrate;
    forming the gate electrode layer over the conductive base layer; and
    etching the conductive base layer that is not overlapped with the gate electrode layer to be removed.

8. A method for manufacturing a thin film transistor, comprising the steps of:
    forming a wiring over a substrate with an insulating surface;
    forming a first semiconductor layer containing an impurity of one conductivity type over the wiring;
    forming a first mask over the first semiconductor layer;

etching the first semiconductor layer containing the impurity of one conductivity type by using the first mask;

removing the first mask;

forming a second semiconductor layer over the first semiconductor layer and the substrate;

forming a second mask over the second semiconductor layer;

etching the first semiconductor layer and the second semiconductor layer by using the second mask;

removing the second mask;

forming a gate insulating layer over the substrate, the second semiconductor layer, the wiring;

applying a resist over the gate insulating layer;

exposing the resist to light and developing the resist to be processed into a predetermined shape by using the wiring as a mask;

applying a solution over the resist and the gate insulating layer to form a region to give a first wettability thereto;

removing the resist with a predetermined shape after applying the solution to expose a region of the gate insulating layer over the second semiconductor layer; and forming a gate electrode layer over the region by a droplet discharging method, wherein the second region has a higher wettability than the first wettability.

9. The method for manufacturing the thin film transistor according to claim 8, wherein an impurity of one conductivity type is doped to the semiconductor layer by plasma doping.

10. The method for manufacturing the thin film transistor according to claim 8, wherein the step of forming the wiring comprising:

forming a conductive base layer over the substrate;

forming the wiring over the conductive base layer; and oxidizing the conductive base layer that is not overlapped with the wiring to be insulated.

11. The method for manufacturing the thin film transistor according to claim 8, wherein the step of forming the wiring comprising:

forming a conductive base layer over the substrate;

forming the wiring over the base layer; and etching the conductive base layer that is not overlapped with the wiring to be removed.

* * * * *